United States Patent
Murthy et al.

(10) Patent No.: US 7,195,985 B2
(45) Date of Patent: Mar. 27, 2007

(54) CMOS TRANSISTOR JUNCTION REGIONS FORMED BY A CVD ETCHING AND DEPOSITION SEQUENCE

(75) Inventors: Anand Murthy, Portland, OR (US); Glenn A. Glass, Beaverton, OR (US); Andrew N. Westmeyer, Beaverton, OR (US); Michael L. Hattendorf, Beaverton, OR (US); Jeffrey R. Wank, Tigard, OR (US)

(73) Assignee: Intel Corporation, Santa Clara, CA (US)

( * ) Notice: Subject to any disclaimer, the term of this patent is extended or adjusted under 35 U.S.C. 154(b) by 180 days.

(21) Appl. No.: 11/029,740

(22) Filed: Jan. 4, 2005

(65) Prior Publication Data

US 2006/0148151 A1  Jul. 6, 2006

(51) Int. Cl.
*H01L 21/331* (2006.01)
(52) U.S. Cl. .................. 438/341; 438/357; 438/413
(58) Field of Classification Search ............. 438/341, 438/357
See application file for complete search history.

(56) References Cited

U.S. PATENT DOCUMENTS

| | | | |
|---|---|---|---|
| 6,137,149 A | 10/2000 | Kodama et al. | |
| 6,323,525 B1 | 11/2001 | Noguchi et al. | |
| 6,342,421 B1 | 1/2002 | Mitani et al. | |
| 6,774,000 B2 * | 8/2004 | Natzle et al. | ............. 438/300 |
| 2002/0048911 A1 * | 4/2002 | Nuttall et al. | ............. 438/488 |
| 2004/0248368 A1 | 12/2004 | Natzle et al. | |
| 2004/0262683 A1 | 12/2004 | Bohr et al. | |

FOREIGN PATENT DOCUMENTS

| | | |
|---|---|---|
| JP | 07022338 | 1/1995 |
| WO | WO 00/30169 | 5/2000 |

OTHER PUBLICATIONS

Ueno, T. et al., "Dramatically enhanced performance of recessed SiGe source-drain pmos by in-situ etch and regrowth technique (InSERT)", VLSI Technology 2005, Digest of Technical Papers, 2005 Symposium on Kyoto, Japan, Jun. 14-16, 2005.

(Continued)

*Primary Examiner*—Dung A. Le
(74) *Attorney, Agent, or Firm*—Blakely, Sokoloff, Taylor & Zafman LLP

(57) ABSTRACT

This invention adds to the art of replacement source-drain cMOS transistors. Processes may involve etching a recess in the substrate material using one equipment set, then performing deposition in another. Disclosed is a method to perform the etch and subsequent deposition in the same reactor without atmospheric exposure. In-situ etching of the source-drain recess for replacement source-drain applications provides several advantages over state of the art ex-situ etching. Transistor drive current is improved by: (1) Eliminating contamination of the silicon-epilayer interface when the as-etched surface is exposed to atmosphere and (2) Precise control over the shape of the etch recess. Deposition may be done by a variety of techniques including selective and non-selective methods. In the case of blanket deposition, a measure to avoid amorphous deposition in performance critical regions is also presented.

14 Claims, 13 Drawing Sheets

OTHER PUBLICATIONS

Loo, R. et al., "A new technique to fabricate ultra-shallow-junctions, combining in situ vapour HCl etching and in situ doped epitaxial SiGe re-growth", Applied Surface Science, vol. 224., No. 1-4, Mar. 15, 2004, pp. 63-67.

Kah Wee Ang et al., "Enhanced performance in 50nm N-MOSFETS with silicon-carbon source/drain regions", IEEE International Electron Devices Meeting, 2004. IEDM Technical Digest, San Francisco, CA, Dec. 13-15, 2004, pp. 1069-1071.

Zhikuan Zhang et al., "Self-aligned recessed source/drain ultra-thin body SOI MOSFET technology", Proceeding of the 34th European Solid-State Device Research Conference, 2004. ESSDERC 2004, Leuven, Belgium, Sep. 21-23, 2004, pp. 301-304.

* cited by examiner

CMOS TRANSISTOR JUNCTION REGIONS FORMED BY A CVD ETCHING AND DEPOSITION SEQUENCE

BACKGROUND

1. Field

Circuit devices and the manufacture and structure of circuit devices.

2. Background

Increased performance in circuit devices on a substrate (e.g., integrated circuit (IC) transistors, resistors, capacitors, etc. on a semiconductor (e.g., silicon) substrate) is typically a major factor considered during design, manufacture, and operation of those devices. For example, during design and manufacture or forming of metal oxide semiconductor (MOS) transistor devices, such as those used in a complementary metal oxide semiconductor (CMOS), it is often desired to increase movement of electrons in N-type MOS device (n-MOS) channels and to increase movement of positive charged holes in P-type MOS device (p-MOS) channels. A key parameter in assessing device performance is the current delivered at a given design voltage. This parameter is commonly referred to as transistor drive current or saturation current ($I_{Dsat}$). Drive current is affected by factors that include the transistor's channel mobility and external resistance.

Channel mobility refers to the mobility of carriers (i.e. holes and electrons) in the transistor's channel region. Increased carrier mobility translates directly into increased drive current at a given design voltage and gate length. Carrier mobility can be increased by straining the channel region's silicon lattice. For p-MOS devices, carrier mobility (i.e. hole mobility) is enhanced by generating a compressive strain in the transistor's channel region. For n-MOS devices, carrier mobility (i.e. electron mobility) is enhanced by generating a tensile strain in the transistor's channel region.

Drive current is also influenced by other factors that include: (1) the resistances associated with the ohmic contacts (metal to semiconductor and semiconductor to metal), (2) the resistance within the source/drain region itself, (3) the resistance of the region between the channel region and the source/drain regions (i.e. the tip region), and (4) the interface resistance due to impurity (carbon, nitrogen, oxygen) contamination at the location of the initial substrate-epi-layer interface. The sum of these resistances is commonly referred to as the external resistance.

Conventional tip (also commonly called source drain extensions) region fabrication is done by dopant implantation prior to fabricating the gate spacer dielectric layers. The location of the dopants is concentrated near the top surface of the substrate. This narrow band of dopants leads to high spreading resistance, and limits the current flow from channel to salicide contact. In state of the art replacement source-drain architectures, the shape of the recess is better, but is still not fully optimized with respect to spreading resistance.

DETAILED DESCRIPTION

Locally straining transistor channel regions may be accomplished by selective epitaxial deposition of source and drain regions with materials that impart a strain in a MOS transistor's channel region. Such process flows may involve etching the substrate material from the source-drain regions of the transistor in one process operation using an etch reactor. A subsequent operation may involve replacing the removed material with Si alloy material in a deposition reactor. The etch reactor and deposition reactor may be physically different and separate. Thus the substrate must be removed from the etch reactor and exposed to atmospheric pressure environments before initiating the Si alloy deposition process. The Si alloy may be pure Si or $Si_{1-x}Ge_x$ or $Si_{1-x}C_x$ and can be undoped or doped with p-type or n-type dopants. The deposition process may be selective or non-selective. According to embodiments provided herein, the etch reactor and deposition reactor may be physically the same.

Figure 1:
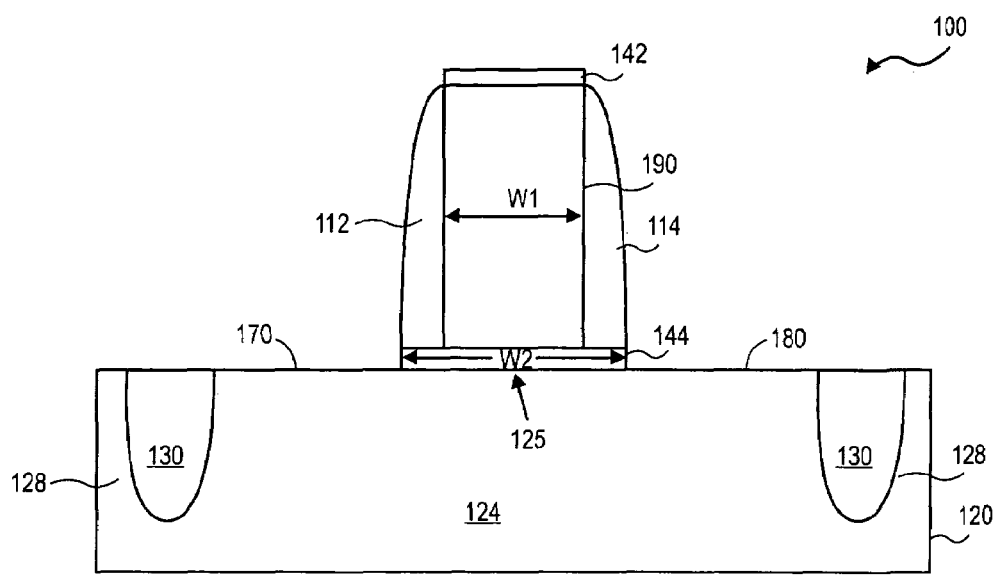
FIG. 1 is a schematic cross-sectional view of a portion of a substrate having a well, gate dielectric, and gate electrode.

For example, FIG. 1 is a schematic cross-sectional view of a portion of a substrate having a well, gate dielectric, gate electrode, and tip material. FIG. 1 shows apparatus 100 including substrate 120 having gate dielectric 144 formed on top surface 125 of substrate 120 over well 124. Gate electrode 190 is formed on gate dielectric 144 and has spacers 112 and 114 formed on its side surfaces. Etch mask 142 is formed on gate electrode 190. Electrically insulating material 130 is also shown to electrically isolate well 124 from surrounding regions 128. Surface 170 and surface 180 are shown adjacent to gate electrode 190. Apparatus 100, and components thereof described above may be further processed, such as in a semiconductor transistor fabrication process that involves one or more processing chambers, to become or be parts of a p-MOS or n-MOS transistor (e.g., by being parts of a CMOS device).

For example, substrate 120 may include, be formed from, deposited with, or grown from silicon, polycrystalline silicon, single crystal silicon, or various other suitable technologies for forming a silicon base or substrate, such as a silicon wafer. For example, according to embodiments, substrate 120 may be formed by growing a single crystal silicon substrate base material having a thickness of between 100 Angstroms and 1000 Angstroms of pure silicon. Alternately, substrate 120 may be formed by sufficient chemical vapor deposition (CVD) of various appropriate silicon or silicon alloy materials to form a layer of material having a thickness between one and three micrometers in thickness, such as by CVD to form a thickness of two micrometers in thickness. It is also considered that substrate 120 may be a relaxed, non-relaxed, graded, and/or non-graded silicon alloy material.

As shown in FIG. 1, substrate 120 includes well 124, such as an N-type well having an electrically negative charge on a P-type material having an electrically positive charge formed by doping substrate 120 during formation or after formation of substrate 120. Specifically, to form well 124, top surface 125 may be doped with phosphorous, arsenic, and/or antimony to form an N-type well of a p-MOS transistor (e.g., a p-MOS device of a CMOS device). Doping as described herein may be performed, for example, by angled doping, such as to implant ions or atoms of the above-noted dopants into a material, such as substrate 120 or a material formed in or on substrate 120. For example, doping may include ion implantation performed by an ion "gun", or an ion "implanter" to bombard surfaces of a substrate with accelerated high velocity ions to implant ions to form doped material. The accelerated ions may penetrate through the surface of the material and scatter into the material below to form a depth of doped material. For example, top surface 125 may be selectively doped, such as by placing a mask over the non-selected area or areas to block the introduction of the dopant from entering the non-selected are or areas, while allowing the dopant to dope well 124.

Alternatively, to form well 124, top surface 125 may be doped with boron and/or aluminum to form a P-type well of a n-MOS transistor (e.g., a n-MOS device of a CMOS device).

Thus, well 124 may be a material suitable for forming a "channel" of a transistor device. For example, a transistor device channel maybe defined as a portion of the material of well 124 under top surface 125 and between surfaces 170 and 180, or junctions formed adjacent to, consuming portions of, and/or including surfaces 170 and 180.

FIG. 1 shows electrically insulating material 130 between well 124 and surrounding regions 128. Material 130 may be various appropriate electrically insulating materials and structures sufficient for electrically isolating well 124 from surrounding regions 128. For example, surrounding regions 128 may be well regions of adjacent or related transistor devices. Specifically, material 130 may be shallow trench isolation (STI) formed between an N-type well of a p-MOS device (e.g., where well 124 has an N-type well) and other regions of substrate 120 to electrically isolate the N-type well from the other regions. Similarly, material 130 may be STI formed between a P-type well of a n-MOS device (e.g., where well 124 is a P-type well) and other regions of substrate 120. Thus, material 130 may isolate well 124 from other regions of substrate 120 to provide for functionality of a transistor formed on top surface 125 (e.g., to isolate well 124 from an adjacent well of an associated device paired with well 124 to form a CMOS device). In one example, where well 124 is an N-type well, one of regions 128 may be a related P-type well of an n-MOS device paired with a P-MOS device formed on top surface 125 to form a CMOS device. Alternatively, where well 124 is a P-type well, one of regions 128 may be a related N-type well of a p-MOS device paired with a n-MOS device formed on top surface 125 to form a CMOS device. Material 130 may be formed by doping through a layer of material located above material 130, and/or may be formed before or after forming well 124.

As shown in FIG. 1, gate dielectric 144 has width W2. Gate electrode 190 is shown formed on gate dielectric 144 with width W1. The thickness of gate dielectric 144 may be generally consistent throughout and conform to the topography of top surface 125 along width W2. Moreover, gate dielectric 144 may be formed of a material having a relatively high dielectric constant (e.g., a dielectric constant greater than or equal to that of silicon dioxide ($SiO_2$), or of a material having a relatively low dielectric constant. A thickness of gate dielectric 144 may be between one and five nanometers in thickness. Gate dielectric 144 may be formed by deposition, such as by CVD, atomic layer deposition (ALD), blanket deposition, selective deposition, epitaxial deposition, ultra high vacuum (UHV) CVD, rapid thermal (RT) CVD, reduced pressure (RP) CVD, molecular beam epitaxy (MBE), and/or other appropriate growing, depositing, or forming processes. Gate dielectric 144 may have an appropriate P-type work function for apparatus 100, such as where apparatus 100 is a p-MOS device. Alternatively, gate dielectric 144 may have an appropriate N-type work function for apparatus 100, such as where apparatus 100 is an n-MOS device. Specifically, gate dielectric 144 may be formed of dielectrics such as silicon dioxide ($SiO_2$), hafnium oxide (HfO), hafnium silicate ($HfSiO_4$), zirconium oxide (ZrO), carbon doped oxide (CDO), cubic boron nitride (CBN), phosphosilicate glass (PSG), silicon nitride ($Si_3N_4$), fluorinated silicate glass (FSG), silicon carbide (SiC), etc.

Gate electrode 190 may be formed, such as by processes described above with respect to forming gate dielectric 144. Moreover, gate electrode 190 may be formed of various semiconductor or conductor materials, such as silicon, polysilicon, crystal silicon, and/or various other appropriate gate electrode materials. Also, gate electrode 190 may be doped during or after formation. For example, gate electrode 190 may be doped with boron and/or aluminum to form a p-type gate electrode having an electrically positive charge (e.g., for a p-MOS device, which may be part of a CMOS device). Conversely, it is also contemplated, that gate electrode 190 may be doped with phosphorous, arsenic, and/or antimony to form a n-type gate electrode having an electrically negative charge (e.g., for a n-MOSn-MOS device, which may be part of a CMOS device).

Gate electrode 190 may have a thickness appropriate for a p-MOS or n-MOS device, such as when apparatus 100 is a p-MOS or n-MOS device. For example, gate electrode 190 may have a thickness to cause a transistor formed on substrate 120 to have a threshold "ON" voltage between 0.1 and 0.5 volts. In some cases, gate electrode 190 may have a thickness of, for example, between 150 and 2000 Angstroms (e.g., between 15 and 200 nanometers(nm)). Gate electrode 190 may have a work function for responding to a gate electrode of a p-MOS device (e.g., where apparatus 100 is a p-MOS device). Alternatively, gate electrode 190 may have a work function for responding to a gate electrode of a n-MOS device (e.g., where apparatus 100 is a n-MOS device).

FIG. 1 shows spacer 112 and spacer 114 formed on surfaces of gate electrode 190 and gate dielectric 144. Specifically, spacer 112 and spacer 114 may be formed on sidewall surfaces of gate electrode 190 and on a top surface of gate dielectric 144 (e.g., a surface opposite from substrate 120). Spacers 112 and 114 may be a dielectric material such as silicon nitride ($Si_3N_4$), silicon dioxide ($SiO_2$), and/or various other appropriate semiconductor device spacer materials.

FIG. 1 also shows etch mask 142 formed on gate electrode 190. Etch mask 142 may be a "hard" mask formed of silicon nitride ($Si_3N_4$), where other material mentioned above for forming gate dielectric 144. For example, etch mask 142 may be used when forming gate electrode 190, gate dielectric 144 and/or spacers 112 and 114. Specifically, portions corresponding to the shape of mask 142 or area around mask 142 may be removed or etched away from above, using mask 142 as an etch stop.

For example, spacers 112 and 114 may be formed by first depositing dielectric material, similar to dielectric materials described above for gate dielectric 144, conformally along surfaces of substrate 120, sidewall surfaces of gate electrode 190, and a top surface etch mask 142. Then the formed or deposited dielectric material may be patterned and etched to create spacers 112 and 114.

According to embodiments, portions of well 124 and substrate 120, such as at surfaces 170 and surface 180, may be removed to form a junction regions in substrate 120 adjacent to gate electrode 190. For example, junctions adjacent to gate electrode 190 may be formed by removing portions of substrate 120 at surfaces 170 and 180 to form junction regions or recesses in substrate 120, and then forming or depositing a junction material into the junction regions. Such removal may include "source-drain recess" etching, so that the junction regions extend under gate dielectric 144.

Figure 2:
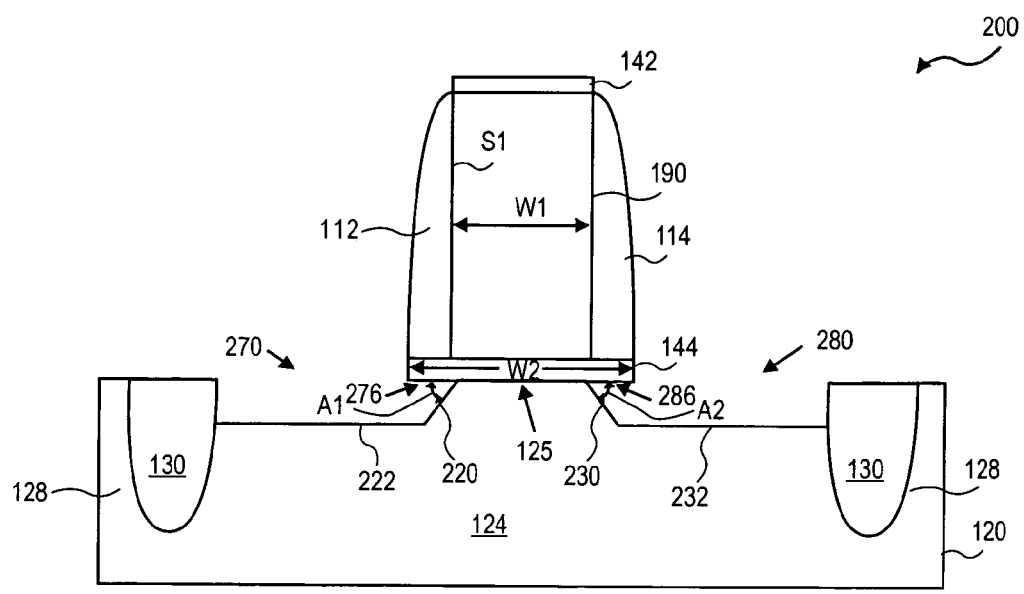
FIG. 2 is the schematic substrate of FIG. 1 after forming junction regions having tip regions.

For example, FIG. 2 is the schematic substrate of FIG. 1 after forming junction regions having tip regions. FIG. 2 shows junction region 270, such as a recess formed in surface 170 of substrate 120 adjacent to gate electrode 190 and source-drain recess below a bottom surface of gate dielectric 144. Similarly, FIG. 2 shows junction region 280, such a recess formed in surface 180 of substrate 120 adjacent to gate electrode 190, and source-drain recess below a bottom surface of gate dielectric 144.

Junction region 270 defines substrate surface 222 (e.g., a base surface of junction region 270), facet 220, and tip region 276. Tip region 276 is between facet 220 and the bottom surface of gate dielectric 144. For instance, it can be said that tip region 276 defines facet 220 having angle A1 between facet 220 and the bottom surface of gate dielectric 144 Similarly, junction region 280 defines substrate surface 232, facet 230, and tip region 286. Tip region 286 is between facet 230 and the gate dielectric 144. Thus, tip region 286 defines facet 230 having angle A2 between facet 230 and bottom surface of gate dielectric 144.

According to embodiments, preferred angles A1 and/or A2 may be angles of between 52° (degrees) and 57°. For example, angles A1 and A2 may both be approximately 52°, 53°, 54°, 54.7°, 54.74°, 54.739137°, 54.8°, 55°, 56°. This range of angles corresponds roughly to alignment with the {111} family of planes as described using conventional Miller index nomenclature. Alternative embodiments allow the A1 and A2 angles to be in the range 0° to 90°, and excluding the preferred range listed above.

According to embodiments, tip regions 276 and 286 may extend under spacer 112, spacer 114, and/or gate electrode 190. For example, tip regions 276 and 286 may extend along top surface 125 under the bottom surface of gate dielectric 144 from a width equal to width W2 to a width of less than width W2, such as a width of greater than zero. Thus, facets 220 and 230 may contact the bottom surface of gate dielectric 144 adjacent to top surface 125 of substrate 120 to form a channel under top surface 125 between facets 220 and 230 (e.g., a channel of a transistor formed in apparatus 200), where facets 220 and 230 may each extend under gate dielectric 144 by a distance of between zero and one-half of width W2. Thus, portions of substrate 120 may be removed to form facets 220 and 230 contacting and extending under the bottom surface of gate dielectric 144 to contact the bottom surface of gate dielectric 144 under spacer 112, spacer 114, and/or gate electrode 190.

It is contemplated that junction region 270 and/or 280 may have a depth below top surface 125 between 800 angstroms and 1300 angstroms. Moreover, junction region 270 and/or 280 may have a width or size appropriate for depositing material into those regions to form junction of a transistor device (e.g., a p-MOS or n-MOS device of a CMOS device).

Junction region 270 and/or 280 may be referred to as "source-drain regions" or "diffusion regions." Also, when an appropriate material is formed, deposited, or grown in junction regions 270 and 280, the resulting material may be referred to as a "junction," a "source," a "drain," or a "diffusion region."

According to embodiments, junction regions 270 and 280 may be formed by removing undesired portions of substrate 120, such as at surfaces 170 and 180. For instance, a patterning two operation process may be used where in the first operation, a photo-resist is used to define regions of a hardmask to be removed (e.g., a hardmask layer over apparatus 100 of FIG. 1). Those regions of the hardmask are then etched away. After that etching, the photo-resist is removed, and a recess etch is performed to form junction regions 270 and 280 by removing undesired portions of substrate 120 (e.g., etching away the undesired exposed portions, not covered by the remaining hardmask). Photolithographic patterning using an etch stop, dielectric material, photo resist, or other suitable material for masking and etch processing (e.g., a negative photo-resist mask, positive photo-resist mask, silicon dioxide $SiO_2$), or silicon nitride $Si_3N_4$) may also be used to define an area to be protected while source-drain recess etching to form junction regions 270 and 280, as shown in FIG. 2.

Suitable non-plasma etch chemistries for removing undesired portions of substrate 120, such as at surfaces 170 and 180 to form junction regions 270 and 280 include chlorine ($Cl_2$), hydrochloric acid (HCl), fluorine ($F_2$), bromine ($Br_2$), HBr and/or other etch processes capable of removing portions of substrate 120. Plasma etches including chemistries of $SF_6$, $NF_3$ or the like are possible as alternative embodiments. Typical epitaxial deposition equipment types available today (e.g., chambers or reactors) can perform the above noted non-plasma etches with little or no modification. A change to enable plasma etching as noted above and CVD deposition in the same reactor is possible, but adds a great deal of complexity to the hardware (e.g., chambers or reactors).

Suitable chambers for etching junction regions 270 and 280 include a CVD chamber, an ALD chamber, a UHVCVD chamber, an RTCVD chamber, an RPCVD chamber, an MBE chamber, a "batch" UHV CVD chamber, a cold-wall UHV CVD chamber, an atmospheric pressure (AP) CVD chamber a low-pressure (LP) CVD chamber, or a chamber reactor that combines the functionality of one or more of these chambers or reactors.

Moreover, etching to form junction regions 270 and 280 may be performed at a pressure of between 1E-4 Torr and 1,000 Torr (e.g., at a pressures within a one decimal range of 1E-3, 1E-2, 0.1, 1.0, 10, 100, or 1000 Torr) in either a "cold-wall" or "hot-wall" reactor. Also, etching to form junction regions 270 and 280 may be performed at typical epitaxial silicon alloy deposition temperatures, for example from 500 to 900° C. A "cold-wall" reactor may be described as a reactor having vessel walls that, during deposition or etching, are at room temperature. A "cold-wall" reactor may have vessel walls fabricated from metal. Alternatively, a "hot-wall" reactor may have vessel wall fabricated from quartz or other ceramics that are at a temperature greater than room temperature during deposition or etching.

For example, junction region 270 and/or 280 may be formed by removing or etching portions of substrate 120 with etchant gas that may contain mixtures including: chlorine ($Cl_2$), hydrochloric acid (HCl), hydrogen ($H_2$), and/or nitrogen ($N_2$). Specifically, an etchant or gas including one or more of the above-noted gases may flow into a chamber in which apparatus 100 is housed at a rate of between five standard cubic centimeters per minute (SCCM) and ten SCCM, at a temperature of between 500 degrees Celsius (° C.) and 800° C. (e.g., a temperature of 500, 525, 540, 550, 560, 575, 600, 625, 650, 675, 700, 750, or 800° C.) for between 30 and 90 minutes (e.g., a period of 30, 35, 40, 45, 50, 55, 60, 65, 75, 85, or 90 minutes) to etch portions of substrate 120 at surfaces 170 and 180. According to embodiments, junction region 270 and/or 280 may be formed at a pressure of between 3E-3 Torr and 7E-3 Torr (e.g., 3E-3, 3.5E-3, 4E-3, 4.5E-3, 5E-3, 5.5E-3, 6E-3, 6.5E-3, or 7E-3). In some cases, chlorine gas is used to etch junction regions 270 and 280 in a chamber as described above, at a temperature of 650° C. and at a pressure of between 3E-3 Torr and 7E-3 Torr, in a 300 millimeter (mm) UHV CVD cold-wall single wafer reactor.

Figure 3A:
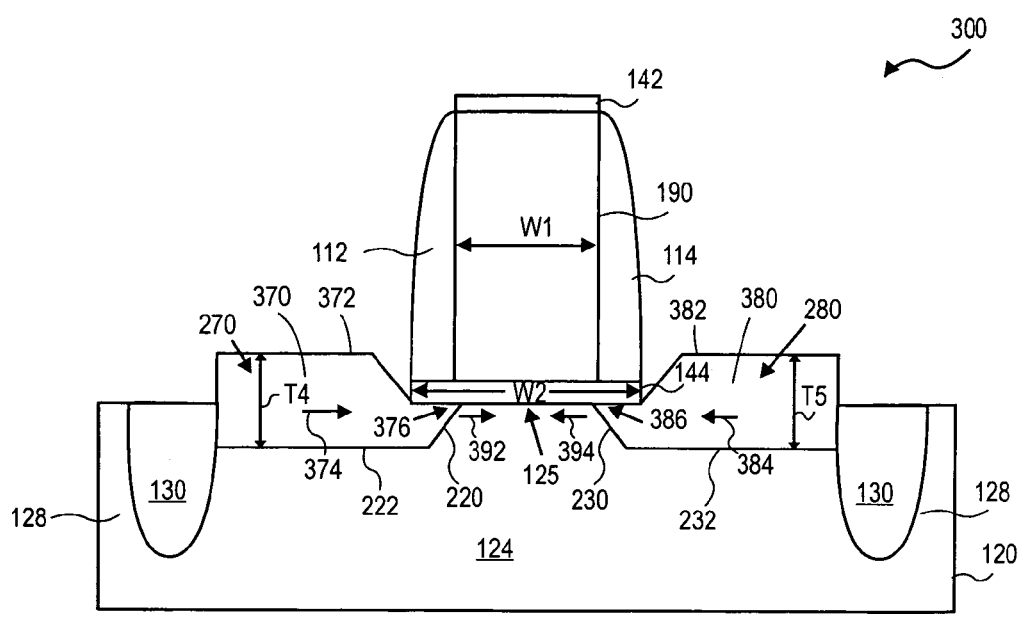
FIG. 3A shows the substrate of FIG. 2 after forming a thickness of material in the junction regions to form junctions.

For example, FIG. 3A shows the substrate of FIG. 2 after forming thickness of a material in the junction regions to form junctions. FIG. 3A shows apparatus 300 having material 370 formed in junction region 270 and material 380 formed in junction region 280. Material 370 and/or material 380 may be described as a junction, source, drain, or diffusion region. In addition, material 370 may be formed to have junction top surface 372 that is superior to top surface 125 of substrate 120. Specifically, material 370 may be a thickness of silicon germanium material having a lattice spacing greater than a lattice spacing of the material of substrate 120. Likewise, material 380 may be formed to have junction top surface 382 that is also superior to top surface 125. For example, material 370 may be thickness T4 of an epitaxial thickness of crystalline silicon-germanium alloy, geranium, or silicon material (e.g., SiGe, such as $Si_xGe_{1-x}$), where the size and/or thickness T4 is sufficient to cause a compressive strain in substrate 120. The material may be pure or doped with p-type dopants such as B and Al. Alternatively, material 370 may be thickness of T4 of an epitaxial thickness of crystalline silicon-carbon alloy material (e.g., $Si_xC_{1-x}$), where the size and/or thickness of T4 is sufficient to cause a tensile strain in substrate 120. The material may be pure or doped with n-type dopants such as P, As and Sb. For example, material 370 may be a thickness of silicon-carbon alloy ($Si_xC_{1-x}$) having a lattice spacing smaller than a lattice spacing of substrate 120. Similarly, material 380 may be a thickness T5 of an epitaxial thickness of crystalline silicon-germanium alloy ($Si_xGe_{1-x}$) having sufficient size and/or thickness T5 to cause a strain in substrate 120.

For example, as shown in FIG. 3A, material 370 may cause compressive strain 374 towards a portion of substrate 120 under top surface 125, and material 380 may cause compressive strain 384 towards the same portion of substrate 120. Thus, strain 374 may cause compressive strain 392 and strain 384 may cause compressive strain 394 in a channel of substrate 120 between material 370 and material 380 (e.g., a compressive strain between p-type junction material formed in junction regions 270 and 280 and in the channel of apparatus 300, where apparatus 300 is a p-MOS device). It can be appreciated that compressive strains 392 and 394 may be strains between facets 220 and 230 sufficient to increase carrier mobility (e.g., mobility of holes in the channel of well 124) between material 370 and material 380. In other words, a channel in substrate 120 may be under a compressive strain caused by a lattice spacing of material 370 and/or material 380 (e.g., where material 370 and material 380 are silicon-germanium alloy material) being larger than a lattice spacing of the material of substrate 120.

In another example, material 370 and material 380 may cause a tensile strain in a channel of apparatus 300 (e.g., if the direction of strains 374, 384, 392, and 394 were reversed). In this case a tensile strain in the channel of apparatus 300, where apparatus 300 is a n-MOS device may be a strain between facets 220 and 230 sufficient to increase carrier mobility (e.g., mobility of electrons in the channel of well 124) between material 370 and material 380. Correspondingly, a channel in substrate 120 may be under a tensile strain caused by a lattice spacing of material 370 and/or material 380 (e.g., where those materials are silicon-carbon alloy) being larger than a lattice spacing of new material of substrate 120.

Material 370 and material 380 may be deposited by chemical vapor deposition or other processes described above for forming gate dielectric 144. For example, material 370 and material 380 may be formed in a chamber as described above for forming junction regions 270 and 280, and for forming gate dielectric 144. Suitable chambers for forming, growing, or depositing materials 370 and 380 include equipment capable of selective deposition of silicon-based elemental or alloyed films. For instance, some suitable chambers for forming material 370 and material 380 include a CVD chamber, an ALD chamber, a UHVCVD chamber, an RTCVD chamber, an RPCVD chamber, an MBE chamber, a "batch" UHV CVD chamber, a cold-wall UHV CVD chamber, an atmospheric pressure (AP) CVD chamber a low-pressure (LP) CVD chamber, or a chamber reactor that combines the functionality of one or more of these chambers or reactors.

Suitable deposition techniques include thermal decomposition of hydride or chlorinated hydride precursor gases on silicon wafers. Deposition pressure may be between 1E-4 Torr and 1000 Torr (e.g., at a pressures within a one decimal range of 1E-3, 1E-2, 0.1, 1.0, 10, 100, or 1000 Torr). Deposition may occur in a cold-wall or hot-wall reactor. Specifically, material 370 and 380 may be formed by selective deposition of silane, disilane, dichlorosilane, and/or methylsilane gas to chemically bond a thickness of silicon alloy or silicon elemental material to surfaces of junction region 270 and 280 to form junctions therein. In an alternative embodiment, this can be performed by non-selective deposition using trisilane as the silicon precursor, and the same alloy and dopant precursor gases mentioned below.

In some process, deposition is performed in a 300 mm epitaxial UHV CVD cold-wall single wafer reactor. Appropriate temperatures for forming material 370 and 380 include room temperature, or a temperature of between 500 and 800° C., and at a pressure of between 300 E-3 Torr and 7 E-3 Torr (e.g., 3E-3, 3.5E-3, 4E-3, 4.5E-3, 5E-3, 5.5E-3, 6E-3, 6.5E-3, or 7E-3). In some examples, material 370 and 380 is formed by introducing disilane at between seven standard cubic centimeters per minute (SCCM) and 20 SCCM, and introducing methylsilane at between 10 SCCM and 300 SCCM. For example, thickness T4 and/or T5 may be a thickness of between 1000 angstroms and 1500 angstroms, such as a thickness of 1050, 1100, 1150, or 1200 angstroms.

Material 370 and 380 may be doped during formation and/or doped after formation. In some embodiments, material 370 and/or 380 may be alloyed or doped during deposition when the silicon precursor flow is accompanied with germane, methylsilane, acetylene, diborane, boron chloride, phosphine, arsine, and/or stibine. For instance, during or after formation, material 370 and 380 may be doped, such as by boron and/or aluminum to form P-type junction material having an electronically positive charge. In one embodiment, material 370 and material 380 may be formed as boron and/or aluminum doped epitaxial crystalline silicon-germanium alloy material in junction regions 270 and 280, and then subsequently doped with additional boron and/or aluminum.

Alternatively, during and/or after formation, material 370 and 380 may be doped, such as by phosphorous, arsenic, and/or antimony to form an N-type junction material having an electrically negative charge. In one embodiment, material 370 and 380 may be silicon carbon alloy epitaxial crystalline material formed in junction regions 270 and 280, and subsequently doped with additional phosphorous, arsenic, and/or antimony.

Thus, material 370 and 380 may be $(Si_x(Ge)_{1-x}:(B,Al)$ for p-MOS and $Si_xC_{1-x}:(P,As,Sb)$ for n-MOS. Subsequent to forming material 370 and 380, apparatus 300 may be thermally treated, such as by annealing.

Moreover, according to embodiments, forming of junction regions 270 and 280, and forming, depositing, or growing of material 370 and material 380 may occur in the in the same chamber, in the same reactor, at the same pressure, at the same temperature, in the same setting, and/or in a chamber or reactor without breaking a seal or vacuum of the chamber or reactor. The process consists of an initial set of etch gas flows, followed by a set of deposition gas flows. Thus, forming material 370 and 380 may be performed in-situ with forming junction regions 270 and 280. It can be appreciated that forming of junction regions 270 and 280 in the same chamber used to deposit material 370 and 380, may reduce undesired impurities including carbon, oxygen and nitrogen in surfaces of junction regions 270 and 280, and material 370 and 380. A suitable chamber for forming of junction regions 270 and 280, and for forming material 370 and 380 includes chambers described above for forming junction regions 270 and 280.

For instance, some suitable chambers for forming of junction regions 270 and 280, and for forming material 370 and 380 in the same chamber include a CVD chamber, an ALD chamber, a UHVCVD chamber, an RTCVD chamber, an RPCVD chamber, an MBE chamber, a "batch" UHV CVD chamber, a cold-wall UHV CVD chamber, an atmospheric pressure (AP) CVD chamber a low-pressure (LP) CVD chamber, or a chamber reactor that combines the functionality of one or more of these chambers or reactors. Deposition mode may be selective or non-selective. Moreover, forming of junction regions 270 and 280 and depositing material 370 and 380 can be performed in the same chamber in the same vacuum (e.g., without opening the chamber, opening a seal of the chamber or exposing the inside of the chamber to air from outside of the chamber).

For example, junction regions 270 and 280, and material 370 and 380 can be formed in a chamber having a pressure of between 1E-4 Torr and 1000 Torr (e.g., at a pressures within a one decimal range of 1E-3, 1E-2, 0.1, 1.0, 10, 100, or 1000 Torr) without opening the chamber, opening a seal of the chamber or exposing the inside of the chamber to air from outside of the chamber.

In one example, a process to perform in-situ recessed source drain etch (e.g., performing junction regions 270 and 280) followed immediately by deposition of source drain material (e.g., deposition of material 370 and 380) is performed in a UHV CVD chamber (e.g., a 300 mm epitaxial UHV CVD cold-walled single-wafer reactor. This process uses a set of etch gases and a set of deposition gases to form junction regions having facets 220 and 230, and then to selectively deposit silicon or silicon alloy material to form junctions on those facets. Moreover, hydrogen ($H_2$) and/or nitrogen ($N_2$) may be used as carrier gases during the etch and/or deposition processes. It is observed that the deposition of materials 370 and 380 may follow the etching of regions 270 and 280 immediately, such as by occurring as the next operation in the processing of apparatus 200, occurring before a seal or vacuum of the chamber is opened, occurring within 30 minutes of forming a recess in regions 270 and 280, and/or occurring after a "pump out" of the chamber to remove the etchant or gas used to form regions 270 and 280.

In one example, an etch process using a flow rate of pure chlorine gas of between five and ten SCCM for a period of between ten and 300 minutes (e.g., a period of 30, 40, 50, 60, 70, 80, 90, 100 or 120 minutes) is used to form regions 270 and 280. Following pump-out of the pure chlorine gas, a deposition process occurs to form materials 370 and 380 in regions 270 and 280, in the same chamber, without exposing the inside of the chamber to the outside air.

The deposition process may include a flow rate of between seven and 20 SCCM of disilane and between ten and 30 SCCM of methylsilane for a period of between ten and 200 seconds (e.g., a period of 10, 15, 20, 25, 30, 35, 40, 45, 50, 60, 70, 80 or 90 seconds), the disilane and methylsilane are then pumped out during a five-second period, this pump-out period is followed by introduction of a pure chlorine gas at a flow rate of between five and 15 SCCM for a period of between ten and 200 seconds (e.g., a period of 10, 15, 20, 25, 30, 35, 40,45, 50, 60, 70, 80 or 90 seconds). The chlorine gas is then pumped out for a period of 5 seconds. The introduction of disilane, methylsilane, and subsequent chlorine etch are repeated between 50 and 100 time (e.g., by repeating 70 times, 75 times, 80 times, 85 times, or another number of times between 50 and 100 times) to form material 370 and 380.

In one example, recessed source drain etch is performed in-situ with deposition of the source drain material in a 300 millimeter (mm) wafer UHV CVD cold-wall single wafer reactor. First, junction regions 270 and 280 are formed by removing or etching portions of substrate 120 with pure chlorine flowing into the chamber at a rate of between five standard cubic centimeters per minute (SCCM) and ten SCCM for one hour while the reactor is kept at a temperature of 650 degrees Celsius. Junction regions 270 and 280 are formed to a depth of 1000 angstroms.

Next, material 370 and 380 are formed in regions 270 and 280 "immediately" after etching (e.g., no other processing is performed between pumping out the chlorine etchant and depositing material 370 and 380) by a standard MOS integration while the reactor is kept at a temperature of 650 degrees Celsius. For instance, material 370 and 380 are formed or deposited by introducing pure disilane at a flow rate of between seven and 20 SCCM and ten percent methylsilane in $H_2$ at a flow rate of between 10 and 30 SCCM for a period of 30 seconds, and the pumping out for a period of five seconds. The pump-out period is followed by introduction of pure chlorine gas at a flow rate of between five and 15 SCCM for a period 30 seconds, and the pumping out for a period of five seconds.

The sequence of introducing disilane and methylsilane, pumping out, introducing chlorine and pumping out is repeated 75 times to form material 370 and 380 of Si—C alloy with one atomic percent of C and a thickness of 1100 angstroms. Moreover, it can be appreciated that the seal or vacuum of the reactor can be kept intact during the 75 iterations. Similarly, the pressure of the chamber and a temperature of 650 degrees Celsius may be maintained during the 75 iterations.

Thus, material 370 and 380 may be formed as an epitaxial layer of Si—C alloy with an atomic percent of C of between 0.1 and two percent (e.g., one percent) of carbon and a thickness of 1100 angstroms. Alternatively, material 370 and 380 may be formed of a SiGe alloy with an atomic percentage of Ge of between 10 and 40 percent (e.g., 20 percent) and a thickness of 1100 angstroms.

It can be appreciated that by forming junction regions 270 and 280, and material 370 and 380 by processes described above and/or in the same chamber without breaking vacuum or a seal of the chamber forms very high-quality epitaxial film junction region material 370 and 380 in junction regions 270 and 280 without interfacial contaminants, and strained channels for increased electron or hole mobility, as well as increased drive current in at least the following four ways:

1. Facets 220 and 230 may be well defined high quality interfaces for the epitaxial material at the junction location due to high purity. For example, the formation of regions 270 and 280 (including facets 220 and 230) and the formation of material 370 and 380 in a single chamber as described above may decrease the interface resistance due to impurity (e.g., by decreasing the amount of carbon, nitrogen, oxygen in the interface) contamination at the location of the initial substrate-epi-layer interface (e.g., between facets 220 and 230 and material 370 and 380), leading to better interface control, lower $Rex_{external}$ and higher drive current. Similarly, such formation may decrease in interface impurity contamination in material 370 and 380 allowing for higher dopant concentrations in material 370 and 380 (e.g., such as boron, aluminum, phosphorus, arsenic and/or antimony), and providing lower resistance within the source/drain region itself, thus causing better interface control, lower $R_{external}$ and higher drive current.

2. The shape of the source-drain recess with facets 220 and 230 angled near 54° provides optimum current spreading. For example, the angle, alignment, and planar characteristics of facets 220 and 230 formed as described above may provide optimal tip shapes and orientations that allow current to spread through the facets and tips (e.g., current flowing between material 370 and 380 and the channel region) more evenly and easily (e.g., in greater overall magnitude or amount) causing lower resistance of the region between the channel region and material 370 and 380 (i.e. the tip region), leading to lower $Rex_{eternal}$ and higher drive current.

3. Facets 220 and 230 angled near 54° also provide maximum resistance to dopant over-run that can cause shorts below the channel, as well as short channel effects. The recess and tip regions 376 and 486 can be placed in closer proximity to the channel without fear of short channel effects or shorting.

4. Strain relaxation by formation of misfit dislocations is enhanced when interface contamination is present. This invention allows use of higher strain in deposited films without relaxation. For instance, the formation of regions 270 and 280 (including facets 220 and 230) and the formation of material 370 and 380 in a single chamber as described above may allow for higher germanium or carbon concentrations in material 370 and 380, leading to higher amounts of strain in the channel causing higher carrier mobility and drive current during transistor use.

Moreover, when forming junction regions 270 and 280, and material 370 and 380 by processes described above, the native oxide build-up at the junction/substrate interface is reduced (e.g., the interface between material 370 and 380 and well 124 of substrate 120); the carbon, oxygen, and/or nitrogen contamination at those interfaces is reduced; the need for wet cleans (e.g., and processing queue time restrictions required for the cleans) is not necessary; the number of tool types required during processing is reduced; loading in nested regions is reduced; planar, smooth, and appropriately oriented tip profiles (e.g., for tips 376 and 386) with (1,1,1) facets are produced; electron and/or hole mobility in the channel is improved due to strain from $(Si_xGe_{1-x}):B,Al$ for p-MOS and $(Si_xC_{1-x}):P$, As, Sb for n-MOS within junction regions); reduces $Rex_{external}$ is reduced due to the high concentration of dopants allowable (e.g., phosphorous or boron doped in the junctions during and/or after epitaxial deposition to form $(Si_xGe_{1-x}):B,Al$ for p-MOS and $(Si_xC_{1-x}):P$, As, Sb for n-MOS.

Figure 3B:
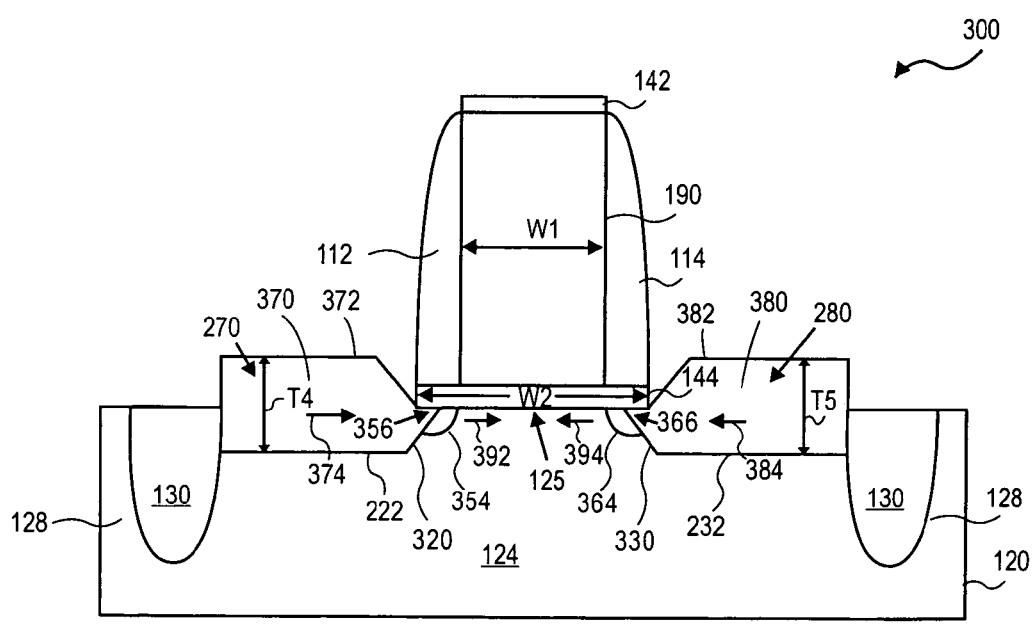
FIG. 3B shows the substrate of FIG. 2 after forming a thickness of material in junction regions having tip implants to form junctions.

In addition, the concepts described above can be applied to form a transistor having junction regions (e.g., source drain regions) that extend under the spacers but not under the gate electrode. In such a case, tip implants (e.g., doped substrate material) may be formed adjacent to the junction regions under the gate electrode. For instance, FIG. 3B shows the substrate of FIG. 2 after forming a thickness of material in junction regions having tip implants to form junctions. FIG. 3B shows junction regions 270 and 280 (e.g., source drain regions) extending under spacers 112 and 114 but not under the gate electrode 190. Also shown, tip implants 354 and 364 (e.g., doped substrate material) may be formed adjacent to the junction regions under the gate electrode. Tip implants 354 and 364 may be formed by standard process in the industry, such as by doping substrate 120 during formation or after formation of substrate 120. Specifically, to form well 124, top surface 125 may be doped with boron and/or aluminum to form p-type tip implants of a p-MOS transistor. After doping the surface of substrate 120 to form the p-type material of the tip implants, portions of the p-type material may be removed or etched to form junction regions 270 and 280 as described above with respect to FIG. 2. Thus, as shown in FIG. 3B facets 320 and 330 may be described as having tips (e.g., tip implants) fabricated from deposited material formed under the bottom surface of the gate dielectric.

Similar to FIG. 3A, FIG. 3B, shows that material 370 may cause compressive strain 374 towards a portion of substrate 120 under top surface 125, and material 380 may cause compressive strain 384 towards the same portion of substrate 120. Thus, strain 374 may cause compressive strain 392 and strain 384 may cause compressive strain 394 in a channel of substrate 120 between tip implants 354 and 364.

It can be appreciated that compressive strains 392 and 394 may be strains between facets 220 and 230 and tip implants 354 and 364 sufficient to increase carrier mobility (e.g., mobility of holes in the channel of well 124) between material 370 and material 380 and tip implants 354 and 364.

In another example, material 370 and material 380 may cause a tensile strain in a channel of apparatus 300 (e.g., if the direction of strains 374, 384, 392, and 394 were reversed). In this case a tensile strain in the channel of apparatus 300, where apparatus 300 is a n-MOS device may be a strain between facets 220 and 230 and tip implants 354 and 364 sufficient to increase carrier mobility (e.g., mobility of electrons in the channel of well 124) between material 370 and material 380.

Figure 4:
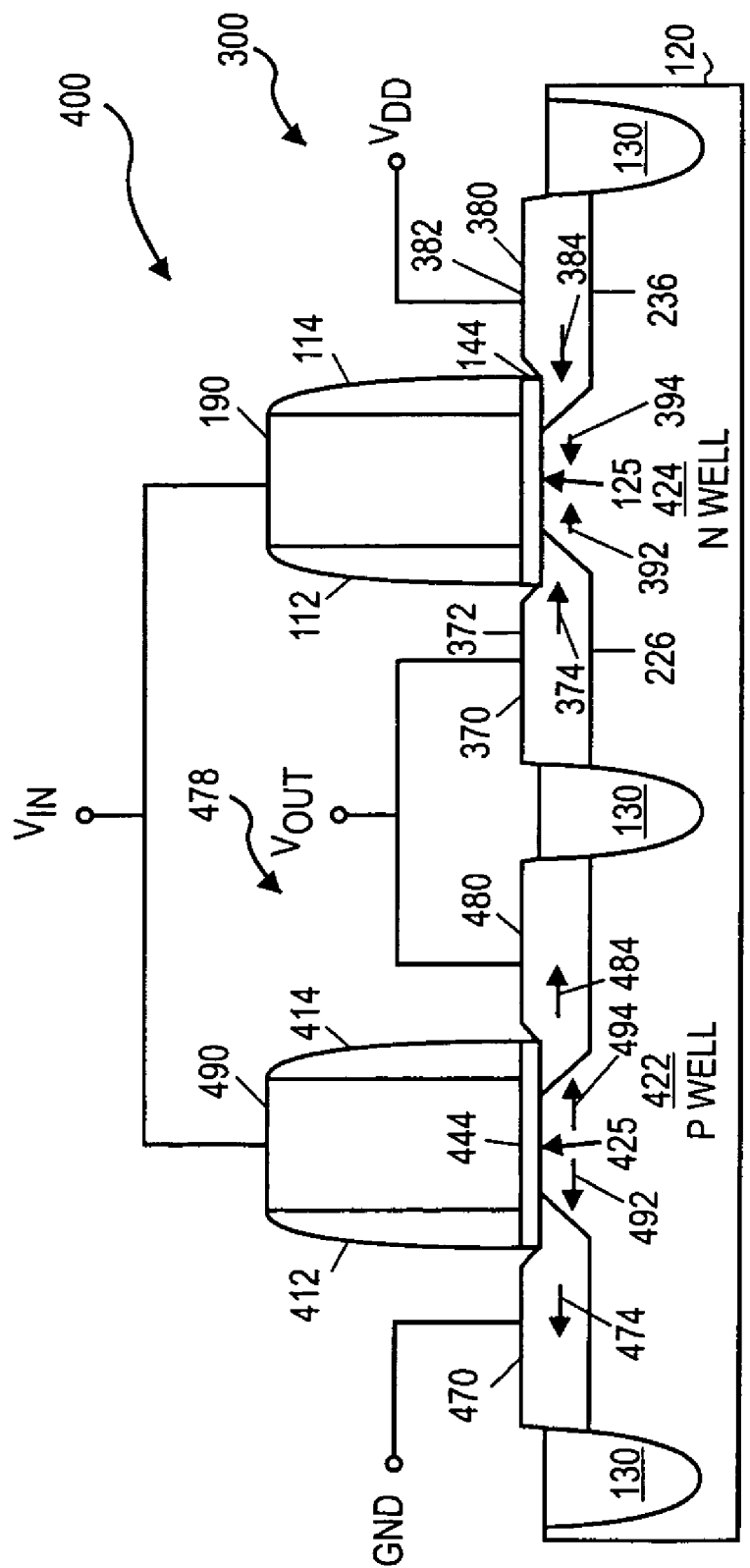
FIG. 4 shows a representative CMOS structure.

For example, FIG. 4 shows a representative CMOS structure. FIG. 4 shows CMOS device 400 having p-MOS device, such as a p-MOS embodiment of apparatus 300 as described above with respect to FIGS. 3A and 3B, connected to n-MOS transistor device 478 in typical fashion. Substrate 120 includes P-type well 422 related to N-type well 124 for forming CMOS device 400, such that P-type well 422 is part of n-MOS transistor device 478 formed on a second area of substrate 120 and defining a different second interface surface 425 of substrate 120 adjacent to N-type well 124. Specifically, for instance, n-MOS device 478 may be formed adjacent to p-MOS apparatus 300 by having n-MOS device 478 electrically isolated from p-MOS apparatus 300 by electrically insulating material 130 as described herein. Moreover, n-MOS device 478 may include a channel below gate dielectric 444 which is below gate electrode 490, and between N-type junctions 470 and 480. n-MOS device 478 is also shown with spacers 412 and 414. n-MOS device 478 may be an n-MOS embodiment of apparatus 300 as described above with respect to FIGS. 3A and B. Thus, CMOS device 400 has ground GND, input voltage $V_{in}$, output voltage $V_{out}$, and bias voltage $V_{DD}$.

According to embodiments, the technology and processes described above with respect to FIGS. 1–4, may or may not be combined with a process for blanket or non-selective deposition of an epitaxial thickness of crystalline material into junction regions to form junctions and a conformal thickness of an amorphous material over a gate electrode, such as during formation of a transistor device. For example, the technology and processes described above with respect to FIGS. 1–4, may or may not be combined with the processes and devices described below with respect to FIGS. 5–12.

Figure 5:
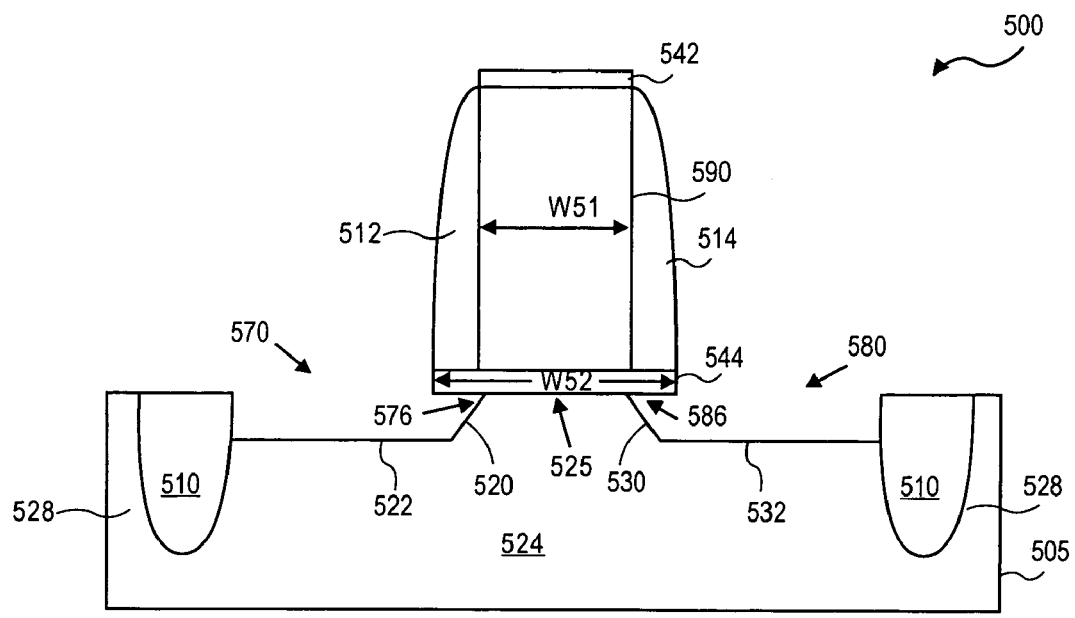
FIG. 5 is the schematic cross-sectional view of a portion of a substrate having a well, gate dielectric, gate electrode, and junction regions having tip regions.

FIG. 5 is the schematic cross-sectional view of a portion of a substrate having a well, gate dielectric, gate electrode, and junction regions having tip regions. FIG. 5 shows apparatus 500 including substrate 505 having gate dielectric 544 formed on top surface 525 of substrate 505 over well 524. Gate electrode 590 is formed on gate dielectric 544 and has spacers 512 and 514 formed on its side surfaces. Etch mask 542 is formed on gate electrode 590. Electrically insulating material 510 is also shown to electrically isolate well 524 from surrounding regions 528. Junction regions 570 and 580 are shown adjacent to gate electrode 590. Apparatus 500, and components thereof described above may be further processed, such as in a semiconductor transistor fabrication process that involves one or more processing chambers, to become or be parts of a p-MOS or n-MOS transistor (e.g., by being parts of a CMOS device).

Features, of FIG. 5 may or may not "correspond" to features of FIG. 1 as described above (e.g., "correspond," such as by having corresponding or similar features, materials, doping, widths, lengths, depths, thicknesses, and functionality; being formed in corresponding or similar chambers or reactors, and/or being formed by corresponding or similar processes). For example, in FIG. 5, substrate 505 may correspond to substrate 120, etch mask 542 may correspond to etch mask 142, spacers 512 and 514 may correspond to spacers 112 and 114, width W51 may correspond to width W1, width W52 may correspond to width W2, and top surface 525 may correspond to top surface 125 of FIG. 1, as described above.

Moreover, in FIG. 5, well 524 may correspond to a P-type well of a n-MOS transistor as described above with respect to well 124 of FIG. 1. Specifically, to form well 524, top surface 525 may be doped with boron and/or aluminum to form a P-type well of a n-MOS transistor (e.g., a n-MOS device of a CMOS device). Thus, well 524 may be a material suitable for forming a "channel" of an n-MOS transistor device. For example, a transistor device channel maybe defined as a portion of the material of well 524 under top surface 525 and between junction regions 570 and 580, or junctions formed therein.

Also, in FIG. 5, material 510 may correspond to material 130, and surrounding regions 528 may correspond to surrounding regions 128, of FIG. 1. Specifically, material 510 may be shallow trench isolation (STI) formed between a P-type well of a n-MOS device (e.g., where well 524 has a P-type well) and other regions of substrate 505 to electrically isolate the P-type well from the other regions (e.g., where one of other regions 528 is an N-type well of a p-MOS device in substrate 505).

Next, gate dielectric 544 of FIG. 5 may correspond to gate dielectric 144 of FIG. 1 as described above. For instance, gate dielectric 144 may have an appropriate N-type work function for apparatus 500, such as where apparatus 500 is an n-MOS device.

Furthermore, in FIG. 5, gate electrode 590 may correspond to gate electrode 190 of FIG. 1 as described above. Thus, gate electrode 590 may be doped with phosphorous, arsenic, and/or antimony to form an N-type electrode material having an electrically negative charge (e.g., for a n-MOS device, which may be part of a CMOS device). Gate electrode 590 may have a thickness appropriate for a p-MOS or n-MOS device, such as when apparatus 500 is an n-MOS device. Gate electrode 590 may have a work function for responding to a gate electrode of an n-MOS device (e.g., where apparatus 500 is an n-MOS device).

FIG. 5 shows junction region 570, such as a recess formed a surface of substrate 505 adjacent to gate electrode 590 and source-drain recess below a bottom surface of gate dielectric 544. Similarly, FIG. 5 shows junction region 580, such a recess formed in a surface of substrate 505 adjacent to gate electrode 590, and source-drain recess below a bottom surface of gate dielectric 544.

Portions of well 524 and substrate 505 of FIG. 5 may be removed to form recesses such as junction regions 570 and 580 in substrate 505 adjacent to gate electrode 590. For example, junctions adjacent to gate electrode 590 may be formed by forming or depositing a junction material into junction regions 570 and 580. Such removal may include "source-drain recess" etching as described above with respect to forming junction regions 270 and 280 of FIG. 2, so that junction regions 570 and 680 extend under gate dielectric 544.

Junction region 570 defines substrate surface 522 (e.g., a base surface of junction region 570), facet 520, and tip region 576. Tip region 576 is between facet 520 and the bottom surface of gate dielectric 544. Similarly, junction region 580 defines substrate surface 532, facet 530, and tip region 586. Tip region 586 is between facet 530 and the bottom surface of gate dielectric 544.

According to embodiments, tip regions 576 and 586 may extend under spacer 512, spacer 514, and/or gate electrode 590. For example, tip regions 576 and 586 may extend along top surface 525 under the bottom surface of gate dielectric 544 from a width equal to width W52 to a width of less than width W52, such as a width of greater than zero. Thus, facets 520 and 530 may contact the bottom surface of gate dielectric 544 adjacent to top surface 525 of substrate 505 to form a channel under top surface 525 between facets 520 and 530 (e.g., a channel of a transistor formed in apparatus 500), where facets 520 and 530 may each extend under gate dielectric 544 by a distance of between zero and one-half of width W52. Thus, portions of substrate 505 may be removed to form facets 520 and 530 contacting and extending under the bottom surface of gate dielectric 544 to contact the bottom surface of gate dielectric 544 under spacer 512, spacer 514, and/or gate electrode 590.

Junction region 570 and/or 580 may be referred to as "source/drain regions" or "diffusion regions." Also, when an appropriate material is formed, deposited, or grown in junction regions 570 and 580, the resulting material may be referred to as a "junction," a "source," a "drain," or a "diffusion region."

Suitable chambers for etching junction regions 570 and 580 include those mentioned above with respect to forming gate dielectric 144. Specifically, suitable chambers for etching junction regions 570 and/or 580 include a CVD chamber, an ALD chamber, a UHVCVD chamber, an RTCVD chamber, an RPCVD chamber, an MBE chamber, a "batch" UHV CVD chamber, a cold-wall UHV CVD chamber, an atmospheric pressure (AP) CVD chamber a low-pressure (LP) CVD chamber, an etch chamber, a high-purity high-flow hydrogen ($H_2$) purge reactor, a chlorine ($Cl_2$) etch chamber, a trisilane deposition reactor, a disilane deposition reactor, or a chamber reactor that combines the functionality of one or more of these chambers or reactors.

Consequently, in FIG. 5, junction regions 570 and 580 may or may not correspond to junction regions 270 and 280, surfaces 522 and 532 may or may not correspond to surfaces 222 and 232, facets 520 and 530 may or may not correspond to facets 220 and 230, and tip regions 576 and 586 may or may not correspond to tip regions 276 and 286 of FIG. 2, as described above. Specifically, in FIG. 5, junction regions 570 and 580 may or may not be formed by chlorine etching or other etching as described above with respect to junction regions 270 and 280. Likewise, deposition of material into junction regions 570 and 580 of FIG. 5 may or may not occur in the same chamber as the chamber in which junction regions 570 and 580 were formed or etched. Next, facets 520 and 530 of FIG. 5 may or may not form an angle with respect to surfaces 522 and 532 similar to angle A1 and angle A2 as described with respect to FIG. 2.

Figure 6:
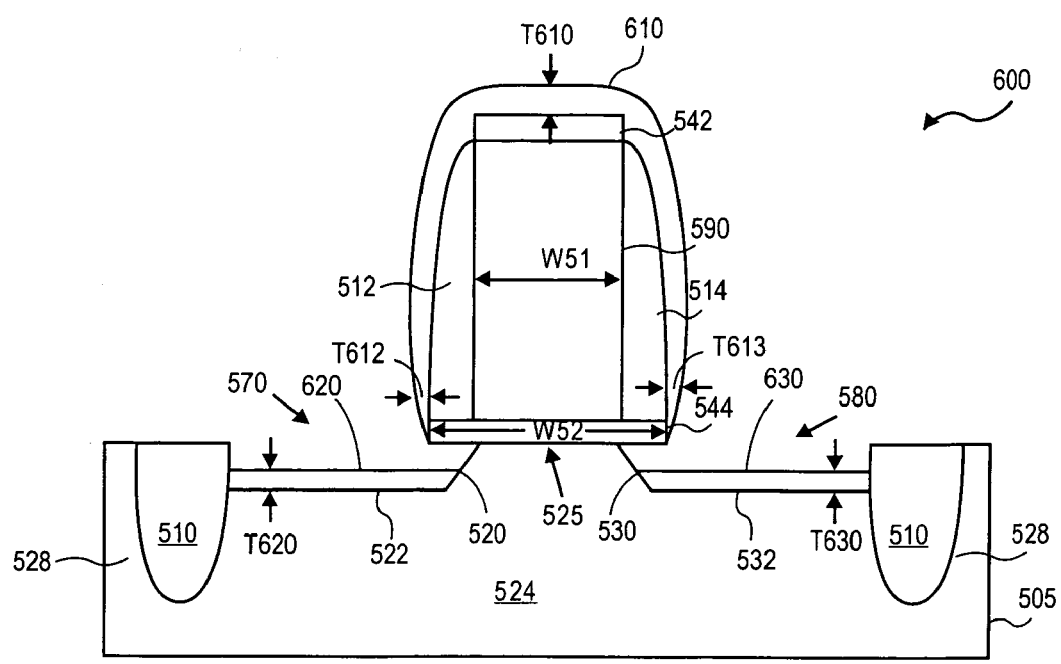
FIG. 6 is the schematic substrate of FIG. 5 after forming a thickness of a crystalline material in the junction regions and a thickness of amorphous material on the gate electrode.

FIG. 6 is the schematic substrate of FIG. 5 after forming a thickness of a crystalline material in the junction regions and a thickness of amorphous material on the gate electrode. FIG. 6 shows apparatus 600 having conformal thickness 610 of amorphous material formed over etch mask 542, spacers 512 and 514, gate electrode 590, and gate dielectric 544. Herein, etch mask 542, spacers 512 and 514, gate electrode 590, and gate dielectric 544 may be referred to as a "gate structure" (e.g., the gate structure of apparatus 500). Conformal thickness 610 is shown having thickness T610 above etch mask 542, thickness T612 beside spacer 512 and thickness T613 besides spacer 514.

FIG. 6 also shows epitaxial thickness 620 of a crystalline material in junction region 570 and having thickness T620. Likewise, epitaxial thickness 630 is formed in junction region 580 and has thickness T630. According to embodiments, thickness 610 (e.g., such as an amorphous layer) and epitaxial thickness 620 and 630 may be formed "simultaneously," such as by deposition of those materials on apparatus 500 during the same period of time, by blanket deposition, and/or by non-selective deposition to form thickness 610, 620, and 630 of apparatus 600. Moreover, during simultaneous formation, the rate of forming conformal thickness 610 may be faster than the rate of forming epitaxial thicknesses 620 and 630

For example, conformal thickness 610 and epitaxial thicknesses 620 and 630 may be formed by non-selective or "blanket" chemical vapor deposition (CVD) of the crystalline and amorphous materials. It is contemplated that epitaxial thickness 620 and 630 may be a silicon alloy or a silicon element material having a lattice spacing different than the lattice spacing of substrate 505. In some embodiments, thicknesses 620 and 630 may be an epitaxial thickness of crystalline phosphorous and/or a silicon-carbon alloy material having a size, thickness, and lattice spacing to cause a tensile strain in substrate 505. It is also contemplated that thicknesses 620 and 630 may be doped with phosphorous, arsenic, and/or antimony during or after formation, such as to form a N-type material having an electrically negative charge. Thus, thickness 620 and thickness 630 may cause a tensile strain in a channel of apparatus 600, such as a region of substrate 505 below top surface 525 and between junction regions 578 and 580.

Conformal thickness 610 may be an amorphous material of the same silicon alloy or silicon element material used to form thickness 620 and 630. Specifically, instead of being a epitaxial thickness, conformal thickness 610 may be a conformal thickness of the same material that forms thickness 620 and 630. As such, conformal thickness 610 may be an amorphous layer with no definite arrangement of atoms in contrast to the very regular arrangement of atoms and crystalline material of thickness 620 and 630. Also, conformal thickness 610 may have a lattice spacing that is different than that of the material etch mask 542, spacers 512 and 514, gate electrode 590, and/or gate dielectric 544 (e.g., the gate structure of apparatus 500). Thus, conformal thickness 610 may cause a tensile strain in gate electrode 590 and/or other components of the gate structure of apparatus 500.

For example, thickness 610, 620, and 630 may be formed (e.g., in the case where apparatus 600 is or will become a n-MOS transistor or device) of a silicon-carbon alloy film blanket or non-selective deposited over the active area of a transistor (e.g., deposited over apparatus 500). The deposition may be a chemical vapor deposition (CVD) using trisilane, methylsilane, and hydrogen (e.g., a $H_2$ carrier gas) had a deposition temperature of less than 550 ° C. (e.g., at a temperature of 450, 500 or 550° C.). In such a setting, epitaxial thickness 620 and 630 are rendered epitaxial on the exposed silicon or surface of junction regions 570 and 580. Specifically, an epitaxial layer is formed on surface 522, facet 520, surface 532, and facet 530. Alternatively, in such a setting, an amorphous thickness is formed on the dielectric, oxide, or nitride of etch mask 542, spacers 512 and 514, gate electrode 590, and gate dielectric 544 (e.g., the gate structure of apparatus 500). The epitaxial crystalline material formed as thickness 620 and 630 may be in-situ doped with phosphorous or arsenic during or after deposition to form N-type electrically negatively charged material.

According to embodiments, thickness 610, 620, and 630 may be formed by introducing trisilane at between 25 milligrams per minute (mg/min) and 200 mg/min, and introducing monomethyl silane at between 15 standard cubic centimeters (SCCM) and 45 SCCM, and introducing $PH_3$ (e.g., by introducing 1 percent $PH_3$ in a hydrogen ($H_2$) carrier gas) at between 400 SCCM and 800 SCCM. In another example, forming thicknesses 610, 620, and 630 may include introducing between 50 and 100 mg/min of trisilane, 30 SCCM of monomethylsilane, and 600 SCCM of $PH_3$.

In one embodiment, in a single wafer 300 mm RT CVD reactor, a chemistry of 20 SCCM of trisilane, 30 SCCM of mono-methyl silane, 20 SLM of $H_2$, at 550° C., and 15 Torr pressure for 12 minutes produces a 500 nano-meter silicon-carbon alloy film with a fully substituted carbon concentration of 3E20 cm cubed as epitaxial thickness 620 and 630. Conformal thickness 610 of an amorphous material is formed in regions not in contact with the surfaces of junction regions 570 and 580 (e.g., regions not in contact with surface 522 and 532 or facet 520 and 530). Thus, conformal thickness 610 may be formed on etch mask 542, spacers 512 and 514, gate electrode 590, and/or gate dielectric 544. One reason for the formation of the crystalline material on surfaces 522 and 532 and facets 520 and 530 is that, on these surfaces, the silicon continues to grow by epitaxially expanding the existing lattice. However, since there is no existing silicon lattice to support growth on surfaces of etch mask 542, spacers 512 and 514, gate electrode 590, and gate dielectric 544, material formed there is of an amorphous nature.

In some embodiments, epitaxial thickness 620 and 630 may be or include a silicon material having a substitutional-carbon concentration of between 0.13 percent and 2.0 percent. Also, in some embodiments, epitaxial thickness 620 and 630 may be or include a silicon material having a phosphorous concentration of between 5E13 atoms per centimeter cubed (atoms/cm) and 5E20 atoms/$CM^3$. For example, epitaxial thickness 620 and 630 may be a silicon alloy or silicon elemental material having a substitutional-carbon concentration of between 0.13 percent and 2.0 percent, and having a phosphorous concentration of between 5E13 atoms per centimeter cubed (atoms/cm) and 5E20 atoms/$CM^3$.

Often, when blanket or non-selective deposition over the active area of a transistor (e.g., deposition over apparatus 500) is continued thickness 610, 620, and 630 may be formed such that thickness 610 expands into the tip regions and/or onto the bottom surface of the gate electrode before thickness 620 and 630 expand to those locations. Specifically, if the deposition process described above with respect to FIG. 6 is continued, it is possible that thickness T612 and T613 will continue to grow and that amorphous material of thickness 610 will expand into tip regions 576 and 586 (see FIG. 5) and or onto bottom surface B1 or bottom surface B2 of gate dielectric 544 (see FIG. 7). Having amorphous material of thickness 610 in the tip regions and/or on the bottom surface of the gate electrode inhibits performance of the transistor. Moreover, after thickness 620 and 630 have been formed to a height above surface 525, etching away or removal of amorphous material of thickness 610 in the tip regions and/or on the bottom surface of the gate electrode leaves a device that does not function properly.

Figure 7:
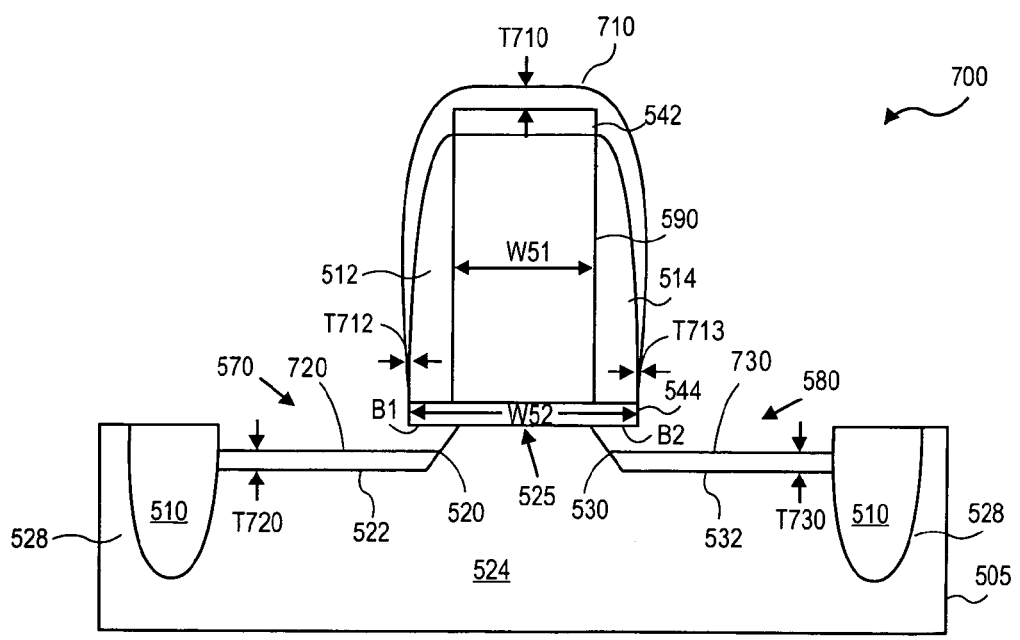
FIG. 7 shows the substrate of FIG. 6 after removing a thickness of the crystalline material and a thickness of the amorphous material.

However, according to embodiments, epitaxial thickness 610, 620 and 630 may be etched back prior to further deposition of material to expand thickness 610, 620 and 630. For instance, FIG. 7 shows the substrate of FIG. 5 after removing a thickness of the crystalline material and a thickness of the amorphous material. FIG. 7 shows apparatus 700, such as an apparatus corresponding to apparatus 600 after a thickness of conformal thickness 610 and epitaxial thickness 620 and 630 are removed. For example, the amorphous material of conformal thickness 610 and the crystalline material of epitaxial thickness 620 and 630 may be removed simultaneously during a process, such as an etch process to form conformal thickness 710 and epitaxial thickness 720 and 730, as shown in FIG. 7. Conformal thickness 710 as thickness T710 above etch mask 542, thickness T712 adjacent to spacer 512, and thickness T713 adjacent to spacer 514. Also, epitaxial thickness 720 has thickness T720, and epitaxial thickness 730 has thickness T730. According to embodiments a rate of removing or etching epitaxial thickness 720 and 730 may be slower than a rate of removing or etching conformal thickness 710. For example, an etch chemistry may be selected that etches the crystalline material of thickness 720 and 730 slower than it etches the amorphous material of thickness 710. Thus, removal of thicknesses 710, 720 and 730 may continue until a remaining vertical thickness of thickness 710 is less than a remaining thickness of thickness 720 and 730. Specifically, thickness T710 may be less than thickness T720 or thickness T730. However, it is also contemplated that thickness T710 may be equal to or greater than thickness T720 and/or thickness T730.

Moreover, according to embodiments, forming thickness 710 may include removing a thickness of thickness 610 sufficiently so that a subsequent forming or deposition of conformal material over thickness 710 does not extend onto or below bottom surface B1 or bottom surface B2 of gate dielectric 544. For example, thickness T712 and thickness T713 may be sufficiently thin so that subsequent deposition of conformal thickness or amorphous material onto thickness 710 does not extend below or onto bottom surfaces B1 and B2.

Thickness T720 and/or thickness T730 may be a thickness of crystalline material between 0.5 nano-meters (nm) and 2 nm, such as 0.8, 0.9, 0.95, 1.0, 1.05, 1.1, 1.15, 1.2, 1.3, or 1.4 nm. Specifically, the net affect of forming thickness 610, 620, and 630, and removing thicknesses thereof to form thickness 710, 720 and 730 may define a formation rate of approximately 1.05 angstroms per second (e.g., 10 nm per minute) for epitaxial thickness 720 and 730. A similar net effect may occur or the thickness 710 in the lateral direction, and may be a little higher in the vertical direction (e.g., in the direction of thickness T710).

Furthermore, in embodiments, removal of thicknesses of thickness 610, 620, and 630 may occur at a rate, for a duration, or with an etchant such that thickness T712 and T713 is less than thickness T720 or thickness T730.

For example, removal of thicknesses of thickness 610, 620, and 630 may include etching with hydrochloric acid, chlorine, or other appropriate etchants or gases. Specifically, such etching may include etching with a hydrochloric acid gas a flow rate of between 100 SCCM and 200 SCCM, such as at a flow rate of 140, 145, 150, 155, or 160 SCCM. It is also contemplated that a dry resist etch, chlorine etch, $CF_4$, plasma, sputter, and/or other etch chemistry or gas capable of removing thicknesses of thickness 610, 620, and 630 may be used.

Moreover, according to embodiments, forming of thickness 610, 620, and 630, and removal of thicknesses thereof to form thickness 710, 720, and 730 may occur in the same chamber for reactor without breaking a seal, vacuum, pressure, ambiance, of the chamber or reactor, and/or without exposing the inside of the chamber or reactor to the outside atmosphere or air. Thus, removal of thickness of material to form thickness 710, 720, and 730 may be performed in-situ with forming of thickness 610, 620, and 630. Specifically, the simultaneous forming and removal of the thicknesses may occur at the same pressure, at the same temperature, in the same ambiance, in the same atmosphere, and/or during the same seal or vacuum of a chamber or reactor. For instance, some suitable chambers for forming of thickness 610, 620, and 630, and removal of thicknesses thereof to form thickness 710, 720, and 730 in the same chamber include a CVD chamber, an ALD chamber, a UHVCVD chamber, an RTCVD chamber, an RPCVD chamber, an MBE chamber, a "batch" UHV CVD chamber, a cold-wall UHV CVD chamber, an atmospheric pressure (AP) CVD chamber a low-pressure (LP) CVD chamber, an etch chamber, a high-purity high-flow hydrogen ($H_2$) purge reactor, a chlorine ($Cl_2$) etch chamber, a trisilane deposition reactor, a disilane deposition reactor, or a chamber reactor that combines the functionality of one or more of these chambers or reactors. Further, appropriate chambers include chambers for performing deposition of epitaxial thicknesses of silicon, silicon alloy, and/or silicon elemental materials; chambers for deposition of conformal thickness of amorphous material; chambers for deposition of crystalline material, chambers for forming blanket or non-selective deposition; chambers for forming selective deposition, chambers for depositing doped material, chambers for depositing silicon germanium (SiGe) and/or chambers for depositing silicon-carbon alloy ($Si_{1-x}C_x$) material.

In some embodiments, forming thickness 610, 620, and 630 and removing thicknesses thereof may occur in the same CVD chamber, at a temperature of between 500 and 750° C. (e.g., at a temperature of 500, 550, 600, 650, 700, or 750° C.), and at a pressure of between 12 and 18 Torr (e.g., at a pressure of 12, 13, 14, 15, 16, 17, or 18 Torr). Also, forming thickness 610, 620, and 630 and removing thicknesses thereof may occur in the same CVD chamber at a pressure of between 1E-4 and 1000 Torr (e.g., at a pressures within a one decimal range of 1E-3, 1E-2, 0.1, 1.0, 10, 100, or 1000 Torr). In some cases, forming thickness 610, 620, and 630 and removing thicknesses thereof may occur in the same CVD chamber at a pressure of between 3E-3 Torr and 7E-3 Torr (e.g., 3E-3, 3.5E-3, 4E-3, 4.5E-3, 5E-3, 5.5E-3, 6E-3, 6.5E-3, or 7E-3). Moreover, there may be a hydrogen ($H_2$) ambient flow of between ten standard liters per minute (SLM) and 30 SLM during the forming and removing.

In some embodiments, forming, depositing, or growing thickness 610, 620, and 630; and then removing, or etching a thickness of thickness 610, 620, and 630 as described above with respect to FIGS. 6 and 7 may describe one iteration or deposition/removal sequence of a multiple iteration process. Thus, the iteration or deposition/removal sequence of FIGS. 6 and 7 may be repeated.

Figure 8:
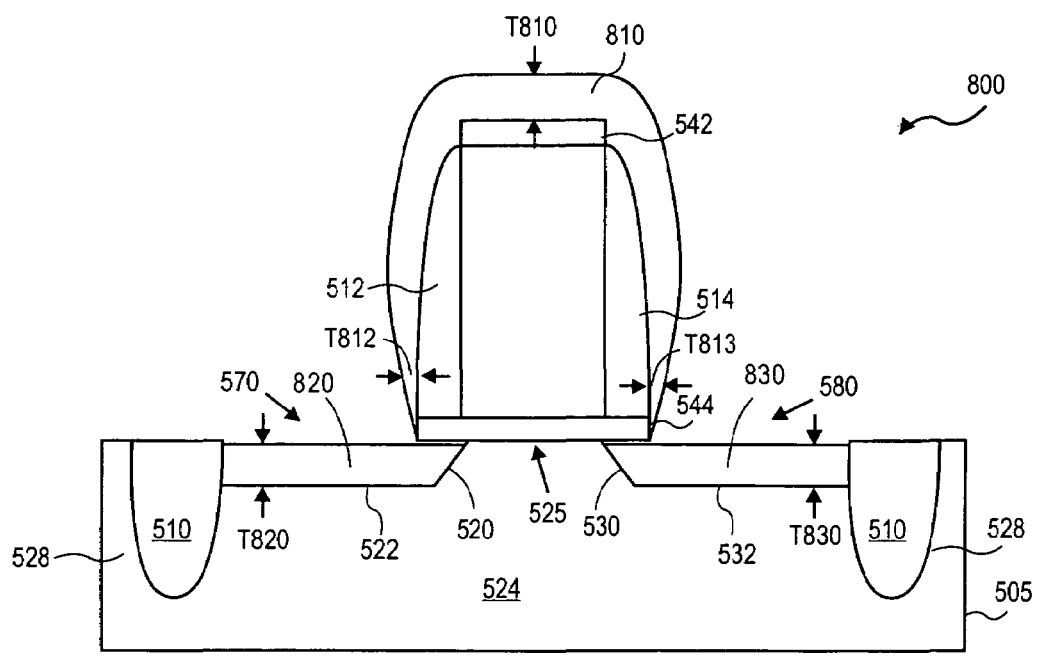
FIG. 8 shows the substrate of FIG. 7 after forming a subsequent thickness of a crystalline material in the junction regions and a subsequent thickness of the amorphous material on the gate electrode.

For example, FIG. 8 shows the substrate of FIG. 7 after forming a subsequent thickness of a crystalline material in the junction regions and a subsequent thickness of the amorphous material on the gate electrode. FIG. 8 shows apparatus 800, such as apparatus 700 after reforming or redepositing additional conformal thickness of amorphous material on thickness 710 to form thickness 810, redepositing or depositing additional epitaxial thickness of crystalline material on thickness 720 to form thickness 820, and redepositing or depositing additional epitaxial thickness of crystalline material on thickness 730 to form epitaxial thickness 830. Thus, thickness T810 of conformal thickness 810 may be thicker than thickness T610 or T710. Similarly, thickness T812 may be thicker than thickness T712 or T612. Likewise, thickness T813 may be thicker than T713 or T613.

Similarly, thickness T820 of epitaxial thickness 820 may be thicker than thickness T720 or T620. Likewise, thickness T830 of epitaxial thickness 830 may be thicker than thickness T730 or T630.

It is contemplated that conformal thickness 810 may include material, be formed by a process, have a functionality, and cause strains as described above with respect to conformal thickness 610. Similarly, epitaxial thickness 820 and 830 may correspond to material, be formed by processes, cause strains, and have functionality as described above with respect to epitaxial thickness 620 and 630.

Figure 9:
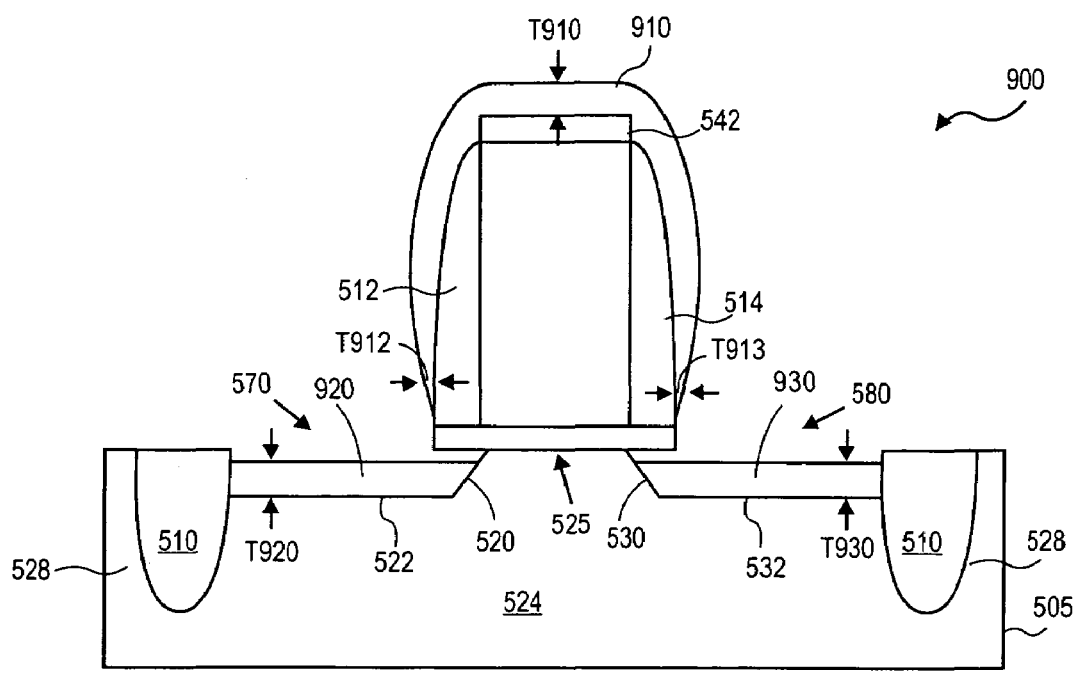
FIG. 9 shows the substrate of FIG. 8 after removing a thickness of the crystalline material and the amorphous material.

Subsequent to forming apparatus 800, thicknesses of thickness 810, 820, and 830 may be removed, such as by etching. For example, FIG. 9 shows the substrate of FIG. 8 after removing a thickness of the crystalline material and the amorphous material. FIG. 9 shows apparatus 900, such as apparatus 800 after removing thicknesses of thickness 810, 820, and 830 to form conformal thickness 910 of amorphous material, epitaxial thickness 920 of crystalline material, and epitaxial thickness 930 of crystalline material. Thus, materials, processes, functionality, and strains of thickness 910, 920, and 930 may correspond to those described above with respect to thickness 710, 720, and 730. It can also be appreciated that the relationship between thickness 910, 920, and 930, as compared to thickness 810, 820, and 830 may correspond to the relationship between thickness 710, 720, and 730 as compared to thickness 610, 620, and 630. Specifically, processes for forming apparatus 800 from apparatus 700 and subsequently forming apparatus 900 from apparatus 800 may correspond to those described above for forming apparatus 600 from apparatus 500 and subsequently forming apparatus 700 from apparatus 600.

Moreover, according to embodiments, processes for forming apparatus 600, 700, 800, and 900 may occur in the same chamber, such as without breaking a seal or vacuum of a chamber, and/or under other settings or conditions as described above with respect to forming apparatus 700 from apparatus 600. Thus, formation of apparatus 600 and 700 may be defined as a first iteration, and forming apparatus 800 and 900 may be defined as a second iteration in a process for deposit/removal iterations. Such iterations may be continued until a desired or selected thickness of an epitaxial crystalline material is formed in the junction regions of the transistor device. Also, such iterations may be continued until a desired or selected thickness of a conformal amorphous material over the gate structure of a transistor device. In some cases, such iterations may be repeated between five and ten times, such as by being repeated five times, six times, seven times, eight times, nine times, or ten times.

It is also contemplated that such iterations may terminate with a deposition or a removal process (e.g., a process corresponding to forming apparatus 600 or apparatus 700). Likewise the deposition or removal portions of the iteration may occur over a period of between five seconds and five minutes, such as where each deposition and/or removal process occurs over a period of ten seconds, 20 seconds, 25 seconds, 30 seconds, 35 seconds, 40 seconds, 45 seconds, 50 seconds, 60 seconds, or 90 seconds.

In one example, forming of thickness 610, 620, and 630 may be performed in-situ with removal of thicknesses of material to form thickness 710, 720, and 730 in CVD chamber. First, thickness 610, 620, and 630 are formed or deposited by introducing trisilane at between 50 mg/min and 100 mg/min, introducing monomethyl silane at 30 SCCM, and introducing PH$_3$ (e.g., one percent PH$_3$ in a H$_2$) at 600 SCCM for 30 seconds while of H$_2$ is introduced into the chamber at a flow of 20 SLM, the chamber is kept at a temperature of between 600 and 650 degrees Celsius, and the chamber is at a pressure of 15 Torr.

Next, thickness 710, 720, and 730 are formed "immediately" after deposition of thickness 610, 620, and 630 (e.g., no other processing is performed between pumping out the deposition gases used to form thickness 610, 620, and 630 and etching thickness 610, 620, and 630 to from thickness 710, 720, and 730). For instance, thickness 710, 720, and 730 are formed by etching thickness 610, 620, and 630 by introducing HCl at 150 SCCM into the chamber for 30 seconds while of H$_2$ is introduced into the chamber at a flow of 20 SLM, the chamber is kept at a temperature of between 600 and 650 degrees Celsius, and the chamber is at a pressure of 15 Torr.

The sequence of introducing trisilane, monomethyl silane, and PH$_3$, pumping out, and then introducing HCl is repeated 7 times to form about 1.05 angstroms/sec in thickness (deposition minus etch) for crystalline material of thickness 720, and 730. The thickness of thickness 710 of amorphous material is about the same in the lateral direction (e.g., thickness T712 and T714), but is a little more in the vertical direction (e.g., thickness T710). Moreover, it can be appreciated that the seal or vacuum of the chamber can be kept in tact during the 7 iterations. Similarly, the conditions where H$_2$ is introduced into the chamber at a flow of 20 SLM, the chamber is kept at a temperature of between 600 and 650 degrees Celsius, and the chamber is at a pressure of 15 Torr may be maintained during the 7 iterations.

Figure 10:
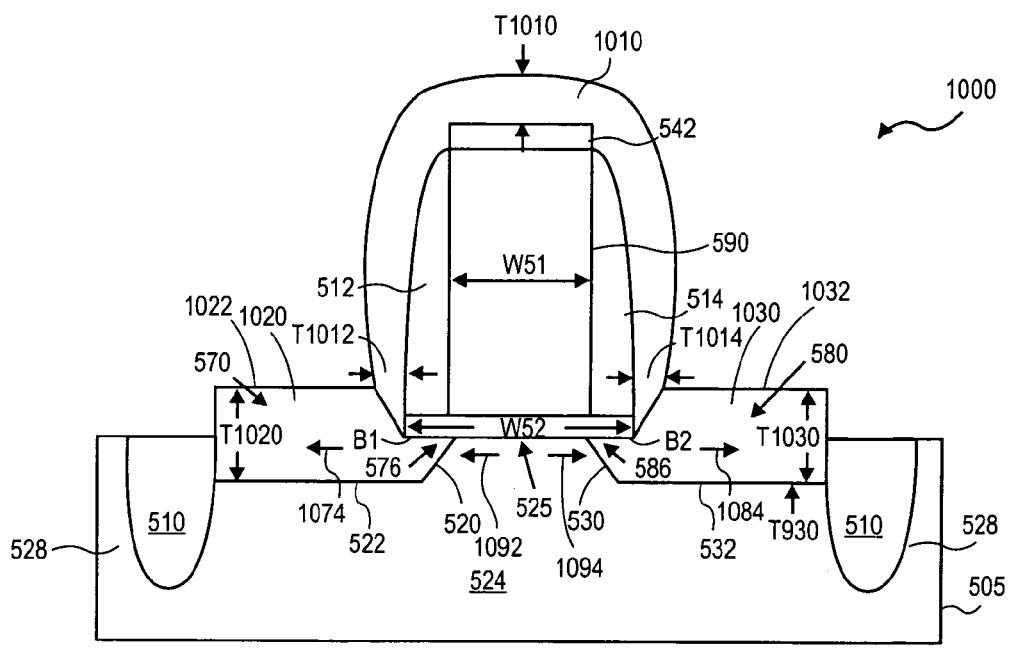
FIG. 10 shows the substrate of FIG. 9 after forming a thickness of crystalline material in the junction regions to form junctions, and after forming a thickness of amorphous material on the gate electrode.

Thus, it is possible to repeat iterations of forming and removal of the conformal and epitaxial thicknesses until a top surface of the epitaxial thicknesses is superior to top surface 525, and/or until the epitaxial thicknesses cause a selected strain in substrate 505. For example, FIG. 10 shows the substrate of FIG. 9 after forming a thickness of crystalline material in the junction regions to form junctions, and after forming a thickness of amorphous material on the gate electrode. FIG. 10 shows apparatus 1000 having conformal thickness 1010 of amorphous material over the gate structure and epitaxial thickness 1020 and 1030 in junction regions 570 and 580. Thickness 1020 has top surface 1022 superior to top surface 525, and thickness 1030 has top surface 1032 superior to top surface 525. FIG. 10 also shows thickness 1020 having thickness T1020, and thickness 1030 having thickness T1030.

It can be appreciated that conformal thickness 1010 may be formed of a material by processes, have a functionality and cause strains as described above with respect to conformal thickness 610. Similarly, epitaxial thicknesses 1020 and 1030 may be formed of a material, by a process, have a functionality, and/or cause strains as described above with respect to epitaxial thickness 620 and 630. For example, thickness 1020 and 1030 may be a sufficient thickness or size of a crystalline material having a lattice spacing different than the lattice spacing of new material of substrate 505 to cause a strain in substrate 505, such as a strain in the channel of apparatus 1000 (e.g., where the channel may be defined as the portion of substrate 505 below top surface 525 and between thicknesses 1020 and 1030). Moreover, thickness 1020 and 1030 may be epitaxial thicknesses of crystalline phosphorous and/or silicon-carbon alloy material, sufficient to cause a tensile strain in substrate 505.

Specifically, as shown in FIG. 10, thickness 1020 may cause tensile strain 1074 away from a portion of substrate 505 under top surface 525, and thickness 1030 may cause tensile strain 1084 away from the same portion of substrate 505. Thus, strain 1074 may cause tensile strain 1092, and strain 1084 may cause tensile strain 1094 in a channel of substrate 505 between thickness 1020 and 1030 (e.g., a tensile strain in the channel of apparatus 1000, or apparatus 1000 is a n-MOS device). According to embodiments, tensile strains 1092 and 1094 may be sufficient strains to increase carrier mobility (e.g., mobility of electrons in the channel of well 524) between thickness 1020 and 1030. In other words, a channel in substrate 505 may be under a tensile strain caused by the lattice spacing of a phosphorous and/or silicon-carbon alloy material in thickness 1020 and 1030 being larger than the lattice spacing of the substrate material.

Also, as described above, with respect to conformal thickness 610, conformal thickness 1010 may cause a tensile strain in the gate structure of apparatus 1000, such as a tensile strain in gate electrode 590.

FIG. 10 also shows epitaxial thickness 1020 filling tip region 576, and epitaxial thickness 1030 filling tip region 586. For example, thickness 1020 may be in contact with and/or atomically bonded to bottom B1 and facet 520. Similarly, thickness 1030 may be attached to and/or atomically bonded bottom B2 and/or facet 530.

It is also considered that thickness 1020 and thickness 1030 may be doped during or after formation with phosphorous, arsenic, and/or antimony to form an N-type material having an electrically negative charge.

For example, once a sufficient or selected thickness of material is deposited or formed as thickness 1020 and 1030 (e.g., after a deposition or etch portion of an iteration) conformal thickness 1010 may be removed. Thus, conformal thickness 1010 of FIG. 10 may be removed from the gate structure of apparatus 1000, such as by selective wet etch. Moreover, a conformal amorphous thickness (e.g., thicknesses 610, 710, 810, 910 and 1010 described above, may be left on isolation material (e.g., material 510) as well. These conformal amorphous thicknesses may also be removed, such as by selective wet etch, thus resulting in a tensile strained N-channel transistor which has increased electron mobility and drive current.

Figure 11:
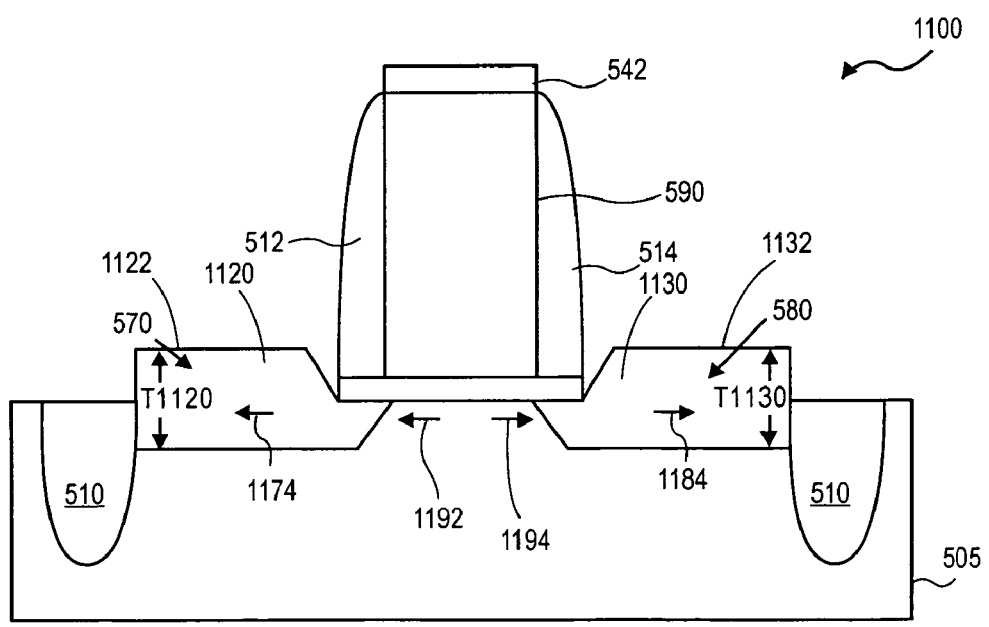
FIG. 11 shows the substrate of FIG. 10 after removing the amorphous materials.

For example, FIG. 11 shows the substrate of FIG. 10 after removing the amorphous materials. FIG. 11 shows apparatus 1100, such as apparatus 1000 after removing or etching conformal thickness 1010 from the gate structure of apparatus 1000. For example, conformal thickness 1010 may be selectively or non-selectively etched using an etch chemistry that leaves an appropriate thickness of epitaxial material in junction region 570 and 580, such as thickness 1120 and 1130. In some embodiments, etching conformal thickness 1010 from the gate structure includes etching a thickness of between five percent and 35 percent of the thickness of thickness 1020 and 1030. Thus, after etching conformal thickness 1010 from the gate structure thickness 1120 and 1130 may be 75, 80, 75, or 90 percent as thick as thickness 1020 and 1030 as described above for FIG. 10. Similarly, top surface 1122 and 1132 may correspond to top surface 1022 and 1032 as described above for FIG. 10. Furthermore, thickness T1120 and T1130 may correspond to thickness T1020 and thickness T1030 as described above for FIG. 10.

After removal of thickness 1010, the remaining transistor (e.g., apparatus 1100) may have strains 1174, 1184, 1192, and 1194 which may correspond to or be greater in magnitude than strains 1074, 1084, 1092, and 1094 of FIG. 10. It is also appreciated that strains 1174, 1184, 1192, and 1194 may correspond to or have directions similar to strains 1074, 1084, 1092, and 1094 of FIG. 10. Specifically, strains 1174, 1184, 1192, and 1194 may correspond to or be within thirty percent in magnitude and ten degrees direction of strains 1074, 1084, 1092, and 1094 of FIG. 10.

Thus, strains 1174, 1184, 1192, and 1194 may cause a sufficient tensile strain in the channel of apparatus 1100 to increase electron mobility and drive current. Moreover, strain 1192 and 1194 may be uniaxial tensile strain caused by increased phosphorous and substitutional-carbon concentration in epitaxial thickness 1120 and 1130. Also, increased phosphorous doping in epitaxial thickness 1120 and 1130 may be greater than the 2E20 cm cubed. Specifically, apparatus 1100 may be a n-MOS transistor with a sufficient increased phosphorous and substitutional-carbon concentration in epitaxial thickness 1120 and 1130 to increase carrier mobility and reduce $R_{External}$. Overall, a transistor similar to apparatus 1100 may have improved saturation current and improved device speed due to the gain in carrier mobility and due to decreased sheet resistant in epitaxial thickness 1120 and 1130.

Figure 12:
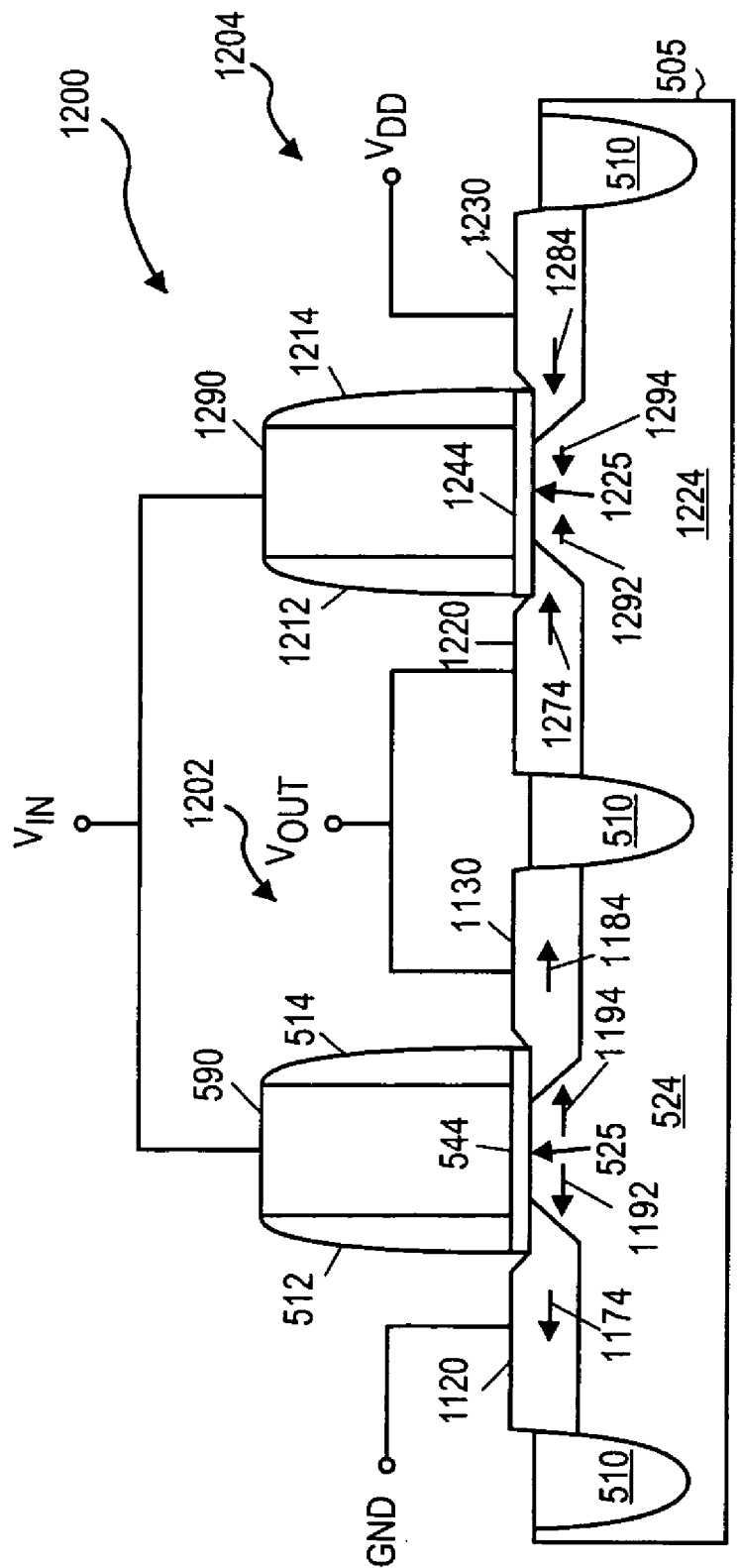
FIG. 12 shows a representative CMOS structure.

Thus, apparatus 1100 may be an n-MOS device of a CMOS device. For example, FIG. 12 shows a representative CMOS structure. FIG. 12 shows CMOS device 1200 having n-MOS device 1202, such as an embodiment of apparatus 1100 as described above with respect to FIG. 11, connected to p-MOS device 1204 in typical fashion. Substrate 505 includes P-type well 524 related to N-type well 1224 for forming CMOS device 1200, such that N-type well 1224 is part of p-MOS transistor device 1204 formed on a second area of substrate 505 and defining a second different interface surface 1225 of substrate 505 adjacent to P-type well 524. Specifically, for instance, p-MOS device 1204 may be formed adjacent to n-MOS device 1202 by having p-MOS device 1204 electrically isolated from n-MOS device 1202 by electrically insulating material 510 as described herein. Moreover, p-MOS device 1204 may include a channel below gate dielectric 1244 which is below gate electrode 1290, and between P-type junctions 1220 and 1230. p-MOS device 1204 is also shown with spacers 1212 and 1214.

FIG. 12 also shows compressive strains 1274, 1284, 1292, and 1294 and p-MOS device 1204. For example, junctions 1220 and 1230 may cause compressive strains 1274 and 1284 towards a portion of substrate 505 under top surface 1225. Thus, strains 1274 and 1284 may cause compressive strains 1292 and 1294 in a channel of p-MOS device 1204. It can be appreciated that compressive strains 1292 and 1294 may be sufficient to increase carrier mobility (e.g., mobility of holes in the channel of well 1224) between junctions 1220 and 1230. Specifically, junctions 1220 and 1230 may be formed of a material having a lattice spacing larger than a lattice spacing of substrate 505 (e.g., by being formed of SiGe, which may or may not be doped with boron and/or aluminum to form a P-type electrically positive charged material). Finally, CMOS device 1200 has ground GND, input voltage $V_{in}$, output voltage $V_{out}$, and bias voltage $V_{DD}$.

In the foregoing specification, specific embodiments are described. However, various modifications and changes may be made thereto without departing from the broader spirit and scope of embodiments as set forth in the claims. The specification and drawings are, accordingly, to be regarded in an illustrative rather than a restrictive sense.

What is claimed is:

1. A method comprising:
    simultaneously forming a first epitaxial thickness of a crystalline material in a first junction region in a substrate, a second epitaxial thickness of a crystalline material in a different second junction region in the substrate, the first and second junction regions adjacent a gate electrode, and a conformal thickness of an amorphous material over the gate electrode, wherein a rate of forming the conformal thickness of an amorphous material is faster than a rate of forming the first and second epitaxial thickness of crystalline material; then
    simultaneously removing a thickness of the amorphous material and a thickness of the crystalline material.

2. The method of claim 1, wherein a rate of removing the thickness of crystalline material is slower than a rate of removing the thickness of an amorphous material.

3. The method of claim 1, wherein simultaneously removing comprises removing a thickness of the amorphous material until a remaining horizontal thickness of the amorphous material is thinner than a remaining vertical thickness of the crystalline material.

4. The method of claim 1, wherein simultaneously removing comprises removing a thickness of the amorphous material until a remaining vertical thickness of the amorphous material is thinner than a remaining vertical thickness of the crystalline material.

5. The method of claim 4, further comprising removing the remaining thickness of the amorphous material.

6. The method of claim 1, wherein a surface of the substrate defines a top surface of the substrate and further comprising repeating simultaneously forming and simultaneously removing until a surface of the first junction region and a surface of the second junction region are superior to the top surface.

7. The method of claim 1, further comprising repeating simultaneously forming and simultaneously removing between five and 10 times to form a thickness of crystalline material of between 0.8 nano-meters and 1.4 nano-meters.

8. The method of claim 1, wherein simultaneously forming and simultaneously removing occur in one of a chemical vapor deposition (CVD) chamber, an ultra high vacuum (UHV) CVD chamber, a rapid thermal (RT) CVD chanter, a reduced pressure (RP) CVD chamber, and without breaking a seal of the chamber.

9. The method of claim 1, wherein simultaneously forming and simultaneously removing occur in the same chemical vapor deposition chamber, at a temperature of between 500 and 750 degrees Celsius and at a pressure of between 12 and 18 Torr.

10. The method of claim 1, wherein simultaneously removing comprises etching with a hydrochloric acid gas; and wherein simultaneously forming comprises non-selective chemical vapor deposition of the crystalline and amorphous materials by introducing trisilane, introducing monomethyl silane.

11. The method of claim 1, wherein simultaneously forming comprises depositing a sufficient epitaxial thickness of a crystalline material having a lattice spacing different than a lattice spacing of the substrate material to cause a strain in the substrate material.

12. The method of claim 1, wherein simultaneously forming comprises depositing a sufficient epitaxial thickness of a crystalline phosphorous doped silicon-carbon alloy material to cause a tensile strain in the substrate.

13. The method of claim 1, wherein the first and second epitaxial thickness of a crystalline material comprises a silicon material having a substitutional-carbon concentration of between 0.13 percent and 2.0 percent, and a phosphorous concentration of between 5E13 atoms per centimeter cubed (atoms/cm$^3$) and 5E20 atoms/cm$^3$.

14. The method of claim 1, wherein Simultaneously removing comprises removing the conformal thickness of an amorphous material from a first sidewall surface of the substrate proximate to the first junction region, and from a second sidewall surface of the substrate proximate to the second junction region, and wherein simultaneously forming comprises depositing a sufficient epitaxial thickness of a crystalline phosphorous silicon-carbon alloy material to fill a first tip region superadjacent to the first sidewall surface and a second tip region superadjacertt to the second sidewall surface.

* * * * *